United States Patent
Horiuchi et al.

(10) Patent No.: US 9,006,586 B2
(45) Date of Patent: Apr. 14, 2015

(54) WIRING SUBSTRATE, ITS MANUFACTURING METHOD, AND SEMICONDUCTOR DEVICE

(75) Inventors: Michio Horiuchi, Nagano (JP); Yasue Tokutake, Nagano (JP); Yuichi Matsuda, Nagano (JP); Tomoo Yamasaki, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 316 days.

(21) Appl. No.: 13/528,987

(22) Filed: Jun. 21, 2012

(65) Prior Publication Data

US 2012/0327626 A1   Dec. 27, 2012

(30) Foreign Application Priority Data

Jun. 27, 2011 (JP) .................................. 2011-142202
Sep. 28, 2011 (JP) .................................. 2011-213528

(51) Int. Cl.
*H05K 1/11* (2006.01)
*H01L 21/48* (2006.01)
*H01L 23/498* (2006.01)
*H05K 3/46* (2006.01)

(52) U.S. Cl.
CPC ............ *H01L 21/486* (2013.01); *H05K 3/4602* (2013.01); *H05K 2201/10378* (2013.01); *H01L 23/49822* (2013.01); *H01L 23/49827* (2013.01); *H01L 21/4857* (2013.01); *H01L 2924/0002* (2013.01)

(58) Field of Classification Search
USPC .................. 174/255, 256, 258, 262, 264–266
See application file for complete search history.

(56) References Cited

U.S. PATENT DOCUMENTS

| | | | |
|---|---|---|---|
| 4,712,161 A | 12/1987 | Pryor et al. | |
| 4,984,132 A * | 1/1991 | Sakurai et al. | 361/794 |
| 5,110,654 A * | 5/1992 | Yokokawa | 428/137 |
| 7,022,399 B2 * | 4/2006 | Ogawa et al. | 428/209 |
| 7,301,107 B2 * | 11/2007 | Karthikeyan et al. | 174/262 |
| 7,738,258 B2 * | 6/2010 | Ohno et al. | 361/767 |
| 7,777,328 B2 * | 8/2010 | Enomoto | 257/700 |
| 2009/0145648 A1 * | 6/2009 | Horiuchi et al. | 174/260 |

FOREIGN PATENT DOCUMENTS

| | | |
|---|---|---|
| JP | 2005-072596 | 3/2005 |
| JP | 2011-181642 | 9/2011 |

* cited by examiner

*Primary Examiner* — Hoa C Nguyen
(74) *Attorney, Agent, or Firm* — Rankin, Hill & Clark LLP

(57) ABSTRACT

One embodiment provides a wiring substrate including: a core substrate having an insulative base member, the insulative base member having a first surface and a second surface, a plurality of linear conductors penetrating through the insulative base member from the first surface to the second surface; an inorganic material layer joined to at least one of the first surface and the second surface of the insulative base member; and a penetration line penetrating through the inorganic material layer, wherein one end of the penetration line is electrically connected to a corresponding part of the linear conductors, without intervention of a bump.

10 Claims, 18 Drawing Sheets

WIRING SUBSTRATE, ITS MANUFACTURING METHOD, AND SEMICONDUCTOR DEVICE

CROSS-REFERENCE TO RELATED APPLICATION(S)

This application claims priority/priorities from Japanese Patent Application No. 2011-142202 filed on Jun. 27, 2011 and from Japanese Patent Application No. 2011-213528 filed on Sep. 28, 2011, the entire contents of which are incorporated herein by reference.

FIELD

The present invention relates to a wiring substrate having a silicon layer or a glass layer, its manufacturing method, and a semiconductor device having the wiring substrate.

BACKGROUND

Wiring substrates and semiconductor devices having a silicon layer and a core substrate to which the silicon layer is joined are known. For example, it is assumed that, in wiring substrates having a silicon layer, the silicon layer functions as a base member through and on which through-holes and interconnections are formed but is not formed with any semiconductor circuits. On the other hand, semiconductor devices are such that semiconductor circuits are formed in the silicon layer of such wiring substrates.

In such wiring substrates and semiconductor devices, the silicon layer and the core substrate are electrically connected to each other by bumps such as solder bumps. To increase the reliability of the bump connections, the space between the silicon layer and the core substrate may be filled with an underfill resin so as to cover the bumps (for example, see JP-2005-072596-A).

However, since the silicon layer and the core substrate are electrically connected to each other by the bumps, due to the technical limitations in forming bump, in positioning the silicon layer and the core substrate with each other, in maintaining bump shapes, etc., it is difficult to increase the density of connections, and the number of connections is restricted. Furthermore, it is difficult to fill the space between the silicon layer and the core substrate with an underfill resin uniformly and completely. Still further, when the silicon layer is thin (e.g., 50 μm), it is difficult to handle the silicon layer at the time of bump connection. Similar problems arise when a glass layer is used instead of the silicon layer.

SUMMARY

One aspect of the present invention provides a wiring substrate including: a core substrate having an insulative base member, the insulative base member having a first surface and a second surface, a plurality of linear conductors penetrating through the insulative base member from the first surface to the second surface; an inorganic material layer joined to at least one of the first surface and the second surface of the insulative base member; and a penetration line penetrating through the inorganic material layer, wherein one end of the penetration line is electrically connected to a corresponding part of the linear conductors, without intervention of a bump.

Another aspect of the present invention provides a manufacturing method of a wiring substrate, including: a first step of preparing a core substrate having an insulative base member, the insulative base member having a first surface and a second surface, a plurality of linear conductors penetrating through the insulative base member from the first surface to the second surface; a second step of joining an inorganic material layer to at least one of the first surface and the second surface of the insulative base member; a third step of forming a through hole through the inorganic material layer; and a fourth step of forming a penetration line by filling the through hole with a conductive material such that one end of the penetration line is electrically connected to a corresponding part of the linear conductors, without intervention of a bump.

The disclosed techniques provide a wiring substrate in which a silicon layer or a glass layer is connected to a core substrate without bumps, a manufacturing method of such wiring substrate, and a semiconductor device having such wiring substrate.

DETAILED DESCRIPTION

Figure 1:
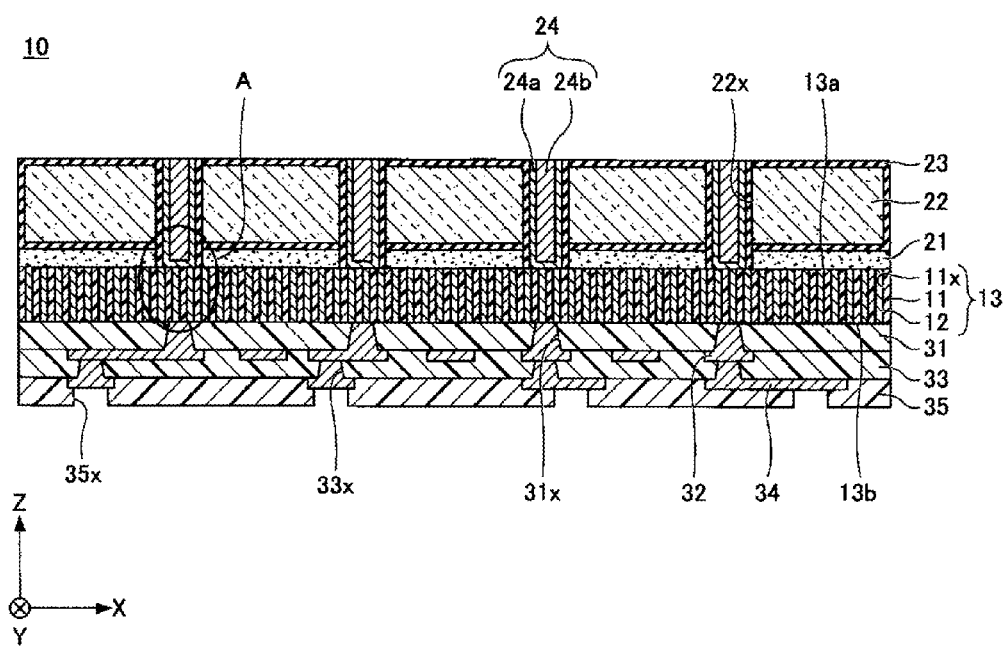
FIG. 1 cross-sectionally illustrates a wiring substrate according to a first embodiment.

Embodiments will be hereinafter described with reference to the drawings. The same constituent members etc. will be given the same reference symbol in the drawings and may not be described redundantly.

<First Embodiment>
[Configuration of Wiring Substrate According to First Embodiment]

Figure 2:
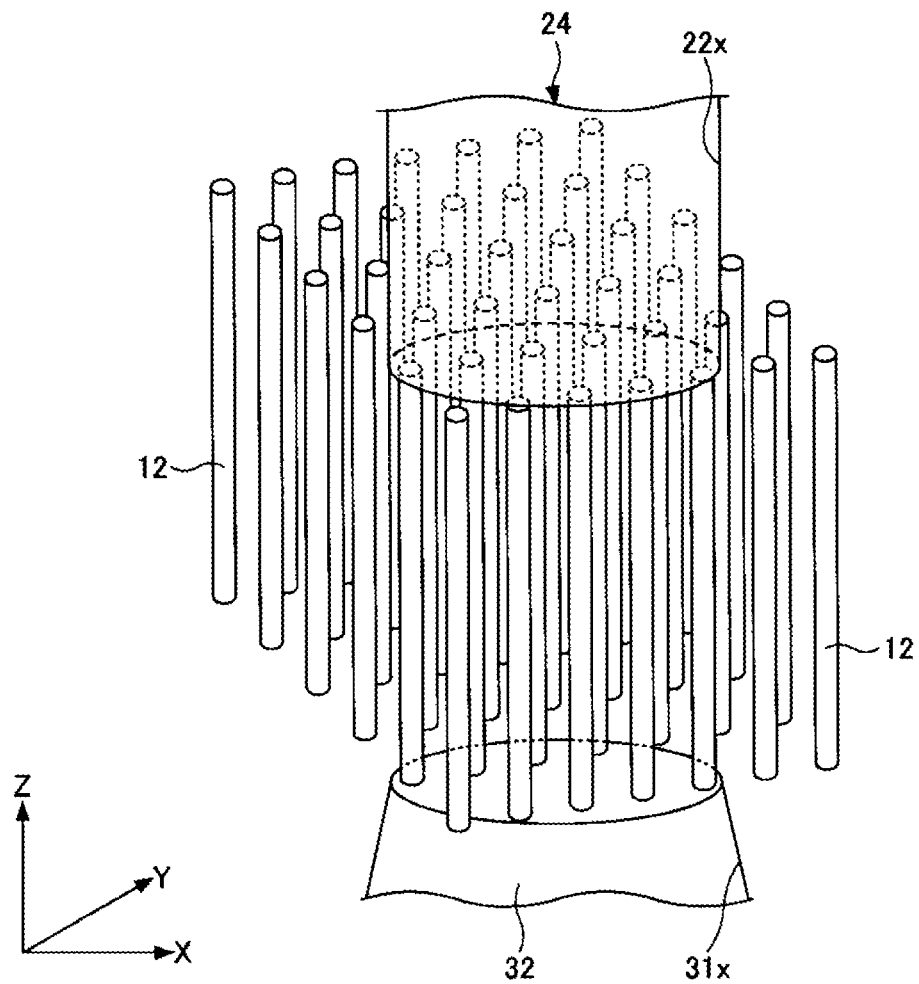
FIG. 2 illustrates the part A in FIG. 1 in a seethrough manner.

FIG. 1 cross-sectionally illustrates the wiring substrate 10 according to the first embodiment. FIG. 2 enlargedly illustrates the part A in FIG. 1 in a seethrough manner. In FIG. 2, part of the constituent members etc. are omitted. In FIGS. 1 and 2, X direction is defined to be parallel with one surface 13a of a core substrate 13 (i.e., the extending direction of the core substrate 13), Y direction is defined to be perpendicular to X direction (the imaginary depth direction of FIG. 1 sheet), and Z direction is defined to be perpendicular to X direction and Y direction (i.e., the thickness direction of the core substrate 13). These definitions also apply to the other drawings.

Referring to FIGS. 1 and 2, the wiring substrate 10 according to the first embodiment has the core substrate 13, a bonding layer 21, a silicon layer 22, an insulating film 23, penetration lines 24, an insulating layer 31, a wiring layer 32, an insulating layer 33, a wiring layer 34 and a solder resist layer 35.

The core substrate 13 measures, for example, about 70 to 100 μm in thickness and about 10 mm×10 mm in size. In the core substrate 13, many through-holes 11x are formed over the entire substrate body 11 in Z direction (thickness direction), and linear conductors (vias) 12 formed of a metal material are filled in the through-holes 11x.

The substrate body 11 may be made of an insulative material including an inorganic dielectric such as alumina (aluminum oxide), mullite, aluminum nitride, glass ceramics (a composite material of glass and ceramics), barium strontium titanate, barium titanate, strontium titanate, or lead titanate zirconate.

The thermal expansion coefficient of the silicon layer 22 which is joined to the one surface 13a of the core substrate 13 is about 3 ppm/° C. On the other hand, where the wiring layers 32 and 34 etc. formed on the other surface 13b of the core substrate 13 are made of, for example, copper (Cu), their thermal expansion coefficient is about 16 to 17 ppm/° C. In order to reduce stress between the silicon layer 22 and the wiring layers 32 and 34 etc. caused by the difference in their thermal expansion coefficients, for example, ceramics or the like having an intermediate thermal expansion coefficient with respect to those of the silicon layer 22 and the wiring layers 32 and 34 may be employed as the material of the substrate body 11. For example, alumina (expansion coefficient: about 6 to 7 ppm/° C.) or mullite (expansion coefficient: about 4.5 ppm/° C.) may be used.

In the core substrate 13, one end face of each linear conductor 12 is exposed in the one surface 13a while the other end face is exposed in the other surface 13b. The linear conductors 12 are formed approximately parallel with each other approximately at regular intervals over almost the entire area of the substrate body 11. Each linear conductor 12 may be circular in a plan view and about 30 to 2,000 nm in diameter. The term "plan view" means a view seen from Z direction in FIG. 1. Preferably, the linear conductors 12 may be formed so densely that the interval between adjoining linear conductors 12 is smaller than their diameter. However, no particular limitations are imposed on the arrangement form of the linear conductors 12; they may be arranged in hexagonal form or grid form.

Each linear conductor 12 functions as a via for connecting a conductor formed on the one surface 13a and a conductor formed on the other surface 13b. However, not every linear conductor 12 may be connected with such conductor, and the liner conductor 12 connected with no conductor may be in an electrically floating state. Example metal materials of the linear conductors (vias) 12 are silver (Ag), copper (Cu) and nickel (Ni).

The silicon layer 22 is joined to the surface 13a of the core substrate 13 by the bonding layer 21. The thickness of the silicon layer 22 may be about 20 to 50 μm. Through-holes 22x are formed through the bonding layer 21 and the silicon layer 22. The through-holes 22x are approximately circular in a plan view. The diameter of the through-holes 22x may be about 3 to 30 μm, and their depths (i.e., the total thickness of the bonding layer 21 and the silicon layer 22) may be about 30 to 80 μm.

The insulating film 23 is formed to cover the surfaces of the silicon layer 22 including the inner side surfaces of the through-holes 22x. The insulating film 23 insulates the silicon layer 22 from the penetration lines 24 etc. Example materials of the insulating film 23 are silicon dioxide ($SiO_2$), silicon nitride (SiN) and polyimide (PI). The thickness of the insulating film 23 may be about 1 to 2 p.m.

The inner side surfaces of the respective through-holes 22x are covered with the insulating film 23 and the penetration lines 24 are filled therein, respectively. One end of each penetration line 24 is directly connected to ends of the linear conductors 12. The other end of each penetration line 24 is exposed from the silicon layer 22, and is flush with the top surface of the insulating film 23 which covers the top surface of the silicon layer 22. The other end of each penetration line 24 serves as an electrode pad to be electrically connected to a semiconductor chip, another wiring substrate, or the like (not shown). Alternatively, an electric circuit may be directly formed on the top surface of the wiring substrate 10. Such electric circuit may include a wiring layer formed on the top surface of the insulating film 23 so as to be electrically connected to the respective penetration lines 24, and an insulating film covering the wiring layer.

Each penetration line 24 has a first layer 24a and a second layer 24b. The first layer 24a is formed to cover a portion of the surface 13a of the core substrate 13 which is exposed in the associated through-hole 22x, the portion of the insulating film 23 which covers the inner side surface of the associated through-hole 22x. The first layer 24a may be formed by laying a titanium (Ti) film and a copper (Cu) film in this order. When a titanium layer is used as the lowest layer of the first layer 24a, the adhesion with respect to the insulating film 23 made of silicon dioxide ($SiO_2$) or silicon nitride (SiN) can be increased. The thickness of the first layer 24a may be about 0.05 to 0.5 μm. The second layer 24b is formed to cover the first layer 24a and to fill the through-holes 22x. The material of the second layer 24ba may be copper (Cu).

The insulating layer 31 is formed to cover the surface 13b of the core substrate 13. The material of the insulating layer 31 may be an insulative resin such as an epoxy resin or a polyimide resin. The thickness of the insulating layer 31 may be about 15 to 25 μm.

The wiring layer 32 includes via parts formed to fill respective via holes 31x in the insulating layer 31 and wiring parts formed on the surface of the insulating layer 31 to have predetermined planar patterns. The via holes 31x are truncated-cone-shaped through-holes which are wider on the side of the insulating layer 33 and reach the surface 13b of the core substrate 13 to expose the linear conductor 12.

The via parts of the wiring layer 32 are electrically connected to the exposed linear conductors 12. The material of the wiring layer 32 may be copper (Cu). The thickness of the wiring parts of the wiring layer 32 may be about 10 to 20 p.m.

The insulating layer 33 is formed to cover the wiring layer 32. The insulating layer 33 may be made of the same insulative resin as the insulating layer 31 is made of. The thickness of the insulating layer 33 may be about 15 to 25 μm.

The wiring layer 34 includes via parts formed to fill respective via holes 33x in the insulating layer 33 and wiring parts formed on the surface of the insulating layer 33 to have predetermined planar patterns. The via holes 31x are truncated-cone-shaped through-holes which are wider on the side of the solder resist layer 35 and reach the surface of the wiring layer 32 to expose portions of the wiring layer 32.

The via parts of the wiring layer 34 are electrically connected to the exposed portions of the wiring layer 32. The material of the wiring layer 34 may be copper (Cu). The thickness of the wiring parts of the wiring layer 34 may be about 10 to 20 μm.

The solder resist layer 35 is formed on the surface of the insulating layer 33 so as to cover the wiring layer 34. The solder resist layer 35 has openings 35x which expose portions of the wiring layer 34. The material of the solder resist layer 35 may be a photosensitive insulative resin. The thickness of the solder resist layer 35 may be about 15 to 25 μm.

The exposed portions of the wiring layer 34 function as electrode pads to be electrically connected to a mounting board such as a mother board (not shown). If necessary, metal layers may be formed on the exposed portions of the wiring layer 34. Examples of each of those metal layers are an Au film, an Ni/Au film formed by laying an Ni film and an Au film in this order, and an Ni/Pd/Au film formed by laying an Ni film, a Pd film and an Au film in this order. Instead of forming metal layers, OSP (organic solderability preservative) processing may be performed on the exposed portions of the wiring layer 34.

External connection terminals such as solder balls or lead pins may be formed on the exposed portions of the wiring layer 34 (or, on the metal layers formed thereon). The external connection terminals serve as terminals for electrical connections to a mounting board such as a mother board (not shown). However, the exposed portions of the wiring layer 34 (or, the metal layers formed thereon) themselves may be used as external connection terminals. The exposed portions of the wiring layer 34 in the respective openings 35x may be circular and about 200 to 1,000 μm in diameter.

[Manufacturing Method of Wiring Substrate According to First Embodiment]

Next, a manufacturing method of the wiring substrate 10 according to the first embodiment will be described. FIGS. 3-10 illustrate a manufacturing process of the wiring substrate 10 according to the first embodiment.

Figure 3:
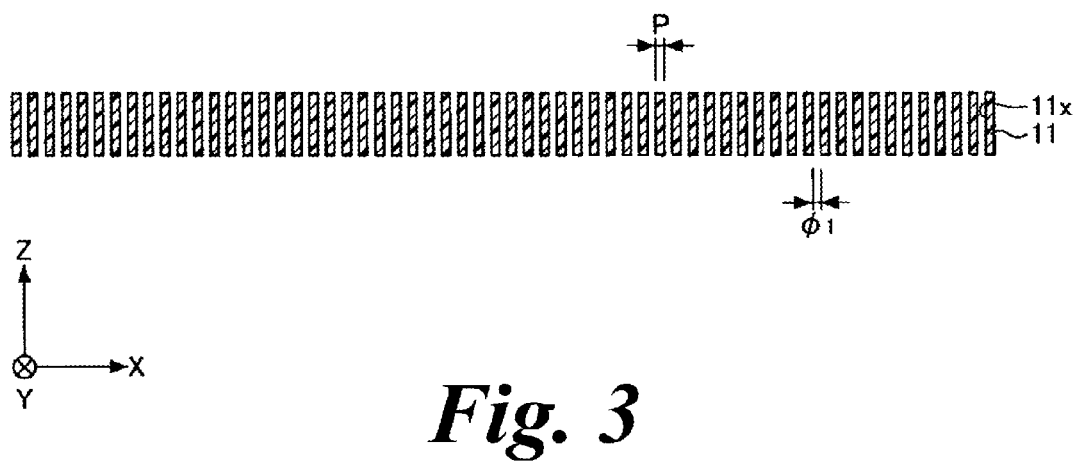
FIGS. 3 to 10 illustrate a manufacturing process of the wiring substrate according to the first embodiment.

First, in a manufacturing step shown in FIG. 3, a substrate body 11 is prepared and a large number of through-holes 11x are formed through the substrate body 11 in its thickness direction over the entire area thereof. The substrate body 11 may be an alumina (aluminum oxide) green sheet which is about 70 to 100 μm in thickness and about 10 mm×10 mm in size. Each through-hole 11x may be circular in a plan view and about 30 to 2,000 nm in diameter $\phi_1$. Preferably, the through-holes 11x may be formed densely so that the interval P between adjoining through-holes 11x is smaller than the diameter $\phi_1$. However, no particular limitations are imposed on the arrangement form of the through-holes 11x; they may be arranged in hexagonal form or grid form.

An example method for forming the through-holes 11x will be described below. The through-holes 11x can be formed by anodic oxidation, for example. More specifically, an aluminum (Al) substrate one surface of which is coated with an insulating layer or an Al electrode layer which is formed on a glass substrate by sputtering or the like is prepared. After its surface is cleaned, the thus-prepared Al substrate or Al electrode layer is immersed in an electrolytic solution (preferably an aqueous solution of sulfuric acid). A pulse voltage is applied between the Al substrate or Al electrode layer (anode) and a platinum (Pt) electrode (cathode) which is opposed to the former, whereby a porous metal oxide film (an aluminum oxide film in which holes having very small diameters are formed regularly) is formed on the surface of the Al substrate or Al electrode layer.

Then, a voltage that is opposite in polarity to the voltage used in the anodic oxidation is applied between the Al substrate or Al electrode layer (cathode) and the platinum electrode (anode), whereby the porous metal oxide film is separated from the Al substrate or Al electrode layer. As a result, a desired substrate body 11 in which through-holes 11x having very small diameters (e.g., about 30 to 2,000 nm) are formed at a high density is obtained.

Example materials, other than alumina (aluminum oxide), of the substrate body 11 are insulative materials such as mullite, aluminum nitride, glass ceramics (a composite material of glass and ceramics), barium strontium titanate, barium titanate, strontium titanate and lead titanate zirconate.

Figure 4:
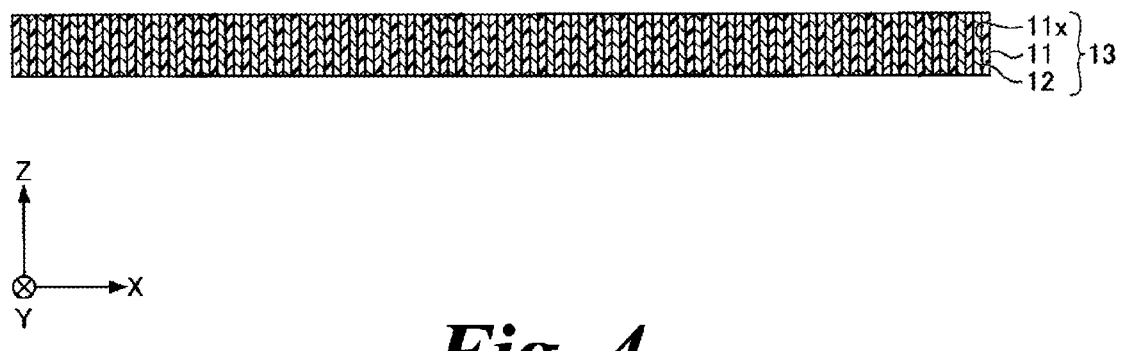

In a manufacturing step of FIG. 4, linear conductors (vias) 12 are formed by filling the through-holes 11x of the substrate body 11 with a metal material. In the following description, the substrate body 11 having the linear conductors 12 may be referred to as a core substrate 13. The linear conductors 12 can be formed by filling the through-holes 11x with a conductive paste made of silver (Ag), copper (Cu), or the like by screen printing, ink jetting, or the like.

Where copper, for example, is used as a metal material, a seed layer is formed on the surfaces (including the inner surfaces of the through-holes 11x) of the substrate body 11 by electroless copper plating and the through-holes 11x are filled with copper by electrolytic copper plating using the seed layers as electricity supply layers. Alternatively, the through-holes 11x may be filled with copper only by electroless copper plating.

If necessary, both end faces of each linear conductor 12 are exposed by planarizing both surfaces of the plated substrate body 11 by mechanical polishing, chemical mechanical polishing (CMP), or the like. As a result, a structure (see FIG. 2) in which the very-small-diameter linear conductors 12 are densely formed in the substrate body 11 can be formed.

Figure 5:
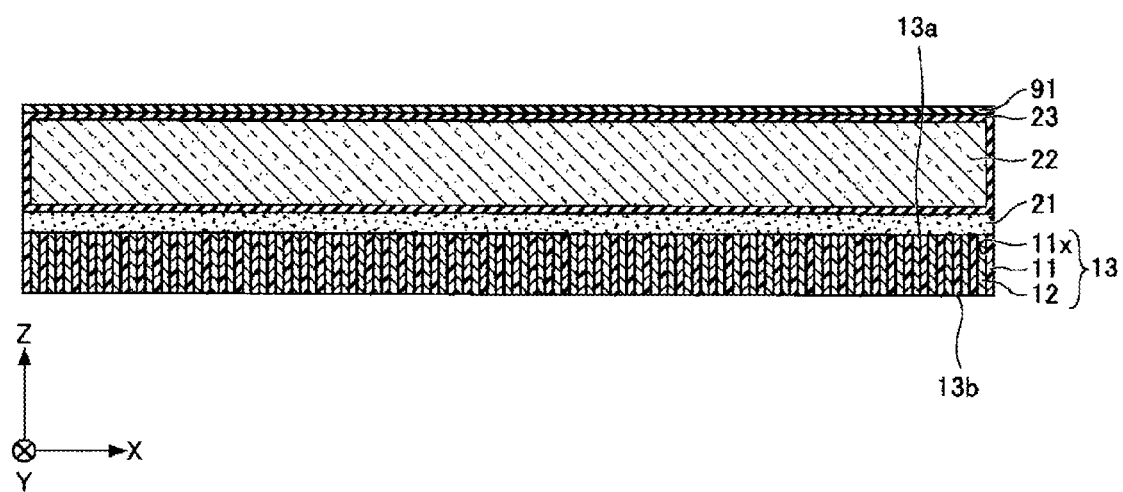

In a manufacturing step of FIG. 5, a silicon layer 22 whose surfaces are covered with an insulating film 23 is joined to one surface 13a of the core substrate 13 by a bonding layer 21. A protective layer 91 is formed on the surface of the insulating film 23. The silicon layer 22 may be one of individual pieces obtained by dividing a silicon wafer of 6 inches (about 150 mm), 8 inches (about 200 mm), 12 inches (about 300 mm), or the like. Whereas the thickness of the silicon wafer is 0.625 mm (6-inch wafer), 0.725 mm (8-inch wafer), 0.775 mm (12-inch wafer), or the like, the thickness of the silicon layer 22 can be reduced as appropriate with a backside grinder or the like.

The thickness of the silicon layer 22 may be reduced to about 20 to 50 μm. By making the silicon layer 22 thinner than about 50 μm, through-holes 22x and electricity supply layers for electrolytic plating therein in a later manufacturing step can be easily formed. On the other hand, if semiconductor circuits are formed in the silicon layer 22, 20 μm or more of the thickness may be necessary to maintain the functions of the circuits. Alternatively, the silicon layer 22 not yet thinned may be joined to the surface 13a of the core substrate 13 by a bonding layer 21 and thinned thereafter.

The bonding layer 21 may be made of an adhesive such as an epoxy adhesive or low-melting-point glass whose melting temperature is lower than or equal to 500° C.

The insulating film 23 may be a thermal oxidation film ($SiO_2$), formed by using a wet thermal oxidation method, specifically, by increasing the temperature of the surface and its vicinity of the silicon layer 22 to be higher than or equal to 1,000° C., for example. The thickness of the insulating film 23 may be about 1 to 2 μm. A silicon dioxide ($SiO_2$) film, a silicon nitride (SiN) film, a polyimide (PI) film, or the like may be formed as the insulating film 23 by CVD or the like.

The protective layer 91 is provided to prevent scattering of dross when through-holes 22x are formed through the silicon layer 22 in a later manufacturing step. The protective layer 91 may be a copper (Cu) plate, a resin layer, or the like. The protective layer 91 may be laid on or applied to the surface of the insulating film 23.

Figure 6:
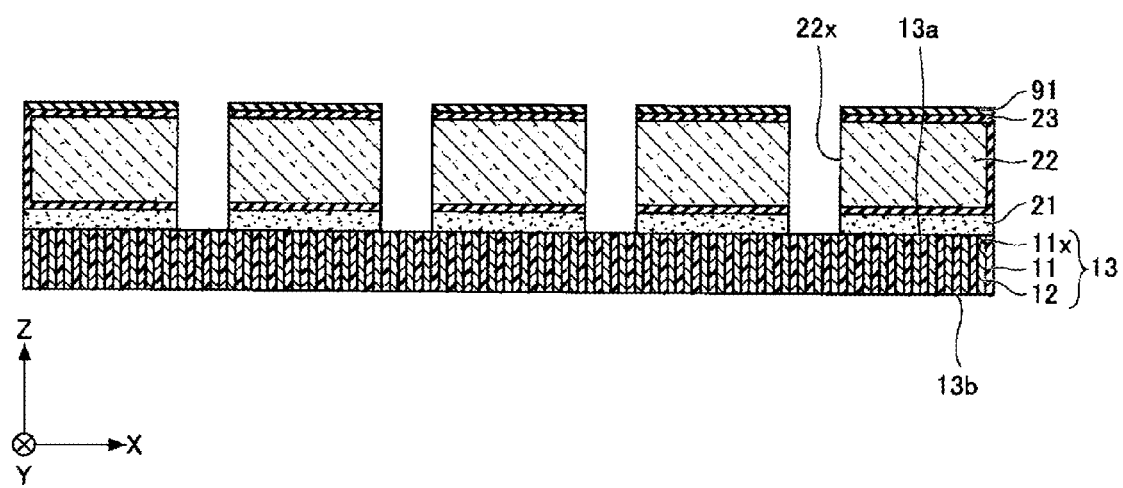

In a manufacturing step of FIG. 6, through-holes 22x are formed through the bonding layer 21 and the silicon layer 22 so as to expose portions of the surface 13a of the core substrate 13 (ends of the linear conductors 12). For example, the through-holes 22x are formed by forming a resist layer (not shown) having openings at positions where through-holes 22x are to be formed and etching the bonding layer 21 and the silicon layer 22 using the resist layer as a mask. Preferably, the etching may be deep reactive ion etching (DRIE) using sulfur hexafluoride ($SF_6$).

Alternatively, the through-holes 22x may be formed by laser processing using a $CO_2$ laser or the like. The through-holes 22x may be approximately circular in a plan view and about 3 to 30 μm in diameter. The depths of the through-holes 22x (i.e., the total thickness of the bonding layer 21 and the silicon layer 22) may be about 30 to 80 μm. The resist layer is removed after completion of this manufacturing step.

Figure 7:
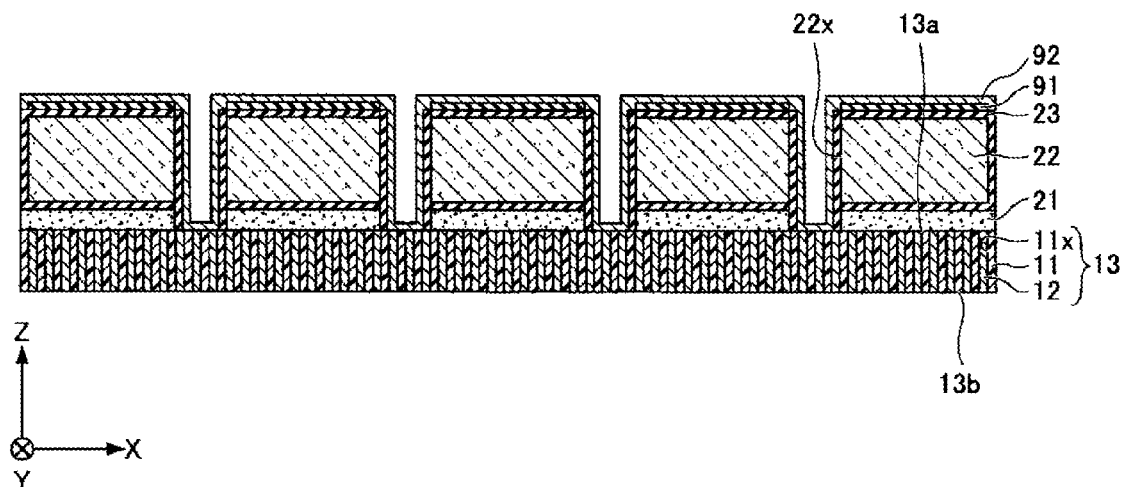

In a manufacturing step of FIG. 7, an insulating film 23 is formed on the inner side surfaces of the through-holes 22x. Then, a conductive layer 92 is formed to cover the exposed portions of the surface 13a of the core substrate 13, the insulating film 23 on the inner side surfaces of the through-holes 22x and the protective film 91. The conductive layer 92 is formed by sputtering, electroless plating, or the like. The conductive layer 92 becomes first layers 24a of respective penetration lines 24 finally as a result of removal of unnecessary portions. The conductive layer 92 may be formed by sequentially laying a titanium (Ti) film and a copper (Cu) film in this order. The thickness of the conductive layer 92 may be about 1 μm.

Alternatively, a conductive layer 92 may be formed after removing the protective layer 91. This provides an advantage that foreign substances attached to the protective layer 91 can be removed together with the protective layer 91.

Figure 8:
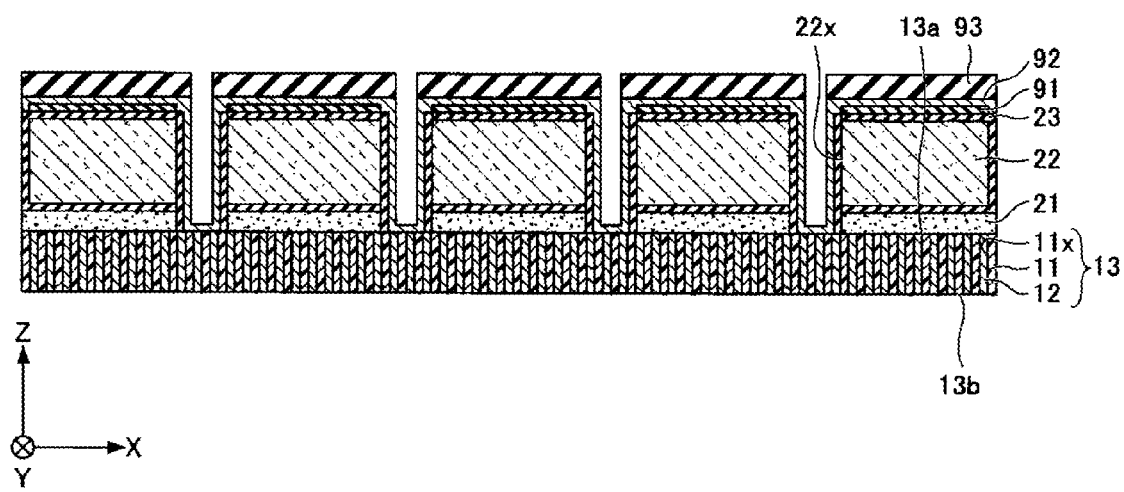

In a manufacturing step of FIG. 8, a resist layer 93 is formed to expose the conductive layer 92 in the respective through-holes 22x. For example, the resist layer 93 is formed by laying a dry film resist on the conductive layer 92 which are located outside the through-holes 22x.

Figure 9:
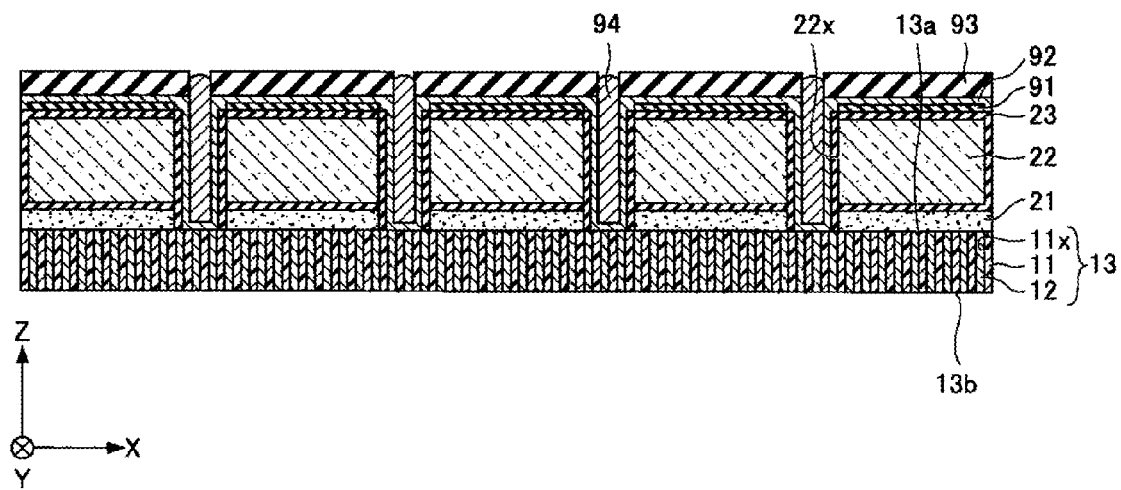

In a manufacturing step of FIG. 9, conductive layers 94 are formed to fill the respective through-holes 22x and to project from the through-holes 22x by causing plating films to precipitate and grow in the respective through-holes 22x by electrolytic plating using the conductive layer 92 as an electricity supply layer. Each conductive layer 94 is electrically connected to the linear conductors 12 via the conductive layer 92. The conductive layers 94 become second layers 24b of penetration lines 24 finally after removal of unnecessary portions. The material of the conductive layers 94 may be copper (Cu).

Figure 10:
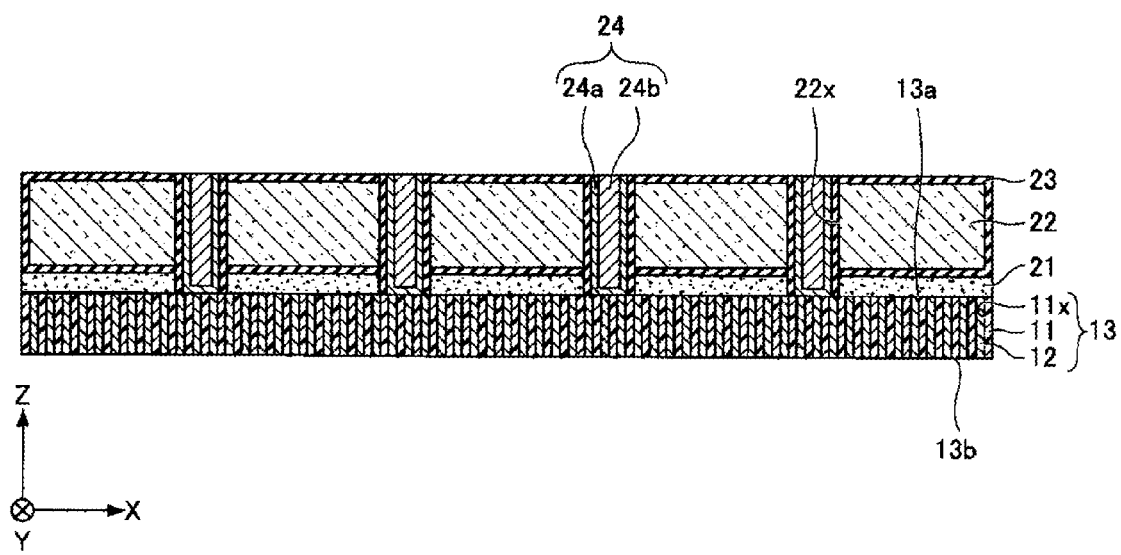

In a manufacturing step of FIG. 10, after the resist layer 93 is removed, the protective layer 91, the conductive layer 92 located outside the through-holes 22x (see FIG. 9) and the conductive layers 94 projected from the through-holes 22x (see FIG. 9) are polished away by CMP (chemical mechanical polishing) or the like. As a result, penetration lines 24 each including a first layer 24a and a second layer 24b are formed.

After completion of the manufacturing step of FIG. 10, an insulating layer 31, a wiring layer 32, an insulating layer 33, a wiring layer 34 and a solder resist layer 35 are sequentially laid on the surface 13b of the core substrate 13.

More specifically, first, a liquid photosensitive polyimide resin, for example, is applied to the surface 13b of the core substrate 13 by spin coating or the like. An insulating layer 31 is formed by setting the liquid photosensitive polyimide resin. Then, via holes 31x are formed so as to penetrate through the insulating layer 31 and expose portions of the surface 13b of the core substrate 13 by photolithography, for example.

When a photosensitive insulative resin is used as a material of the insulating layer 31, via holes 31x can be formed therein at a narrow pitch using photolithography (this is also true of the other insulating layers). If a narrow pitch is not required, for example, a non-photosensitive epoxy resin may be used as a material of the insulating layer 31, and the via holes 31x may be formed by laser processing or the like.

The wiring layer 32 includes via parts formed to fill the respective via holes 31x and wiring parts formed on the surface of the insulating layer 31. The via parts of the wiring layer 32 are electrically connected to the linear conductors 12 that are exposed in the associated via hole 31x. The material of the wiring layer 32 may be copper (Cu). The wiring layer 32 may be formed by any of various wiring forming methods such as a semi-additive method and a subtractive method.

Then, an insulating layer 33, a wiring layer 34 and a solder resist layer 35 are laid sequentially in the same manners as described above. Finally, openings 35x are formed through the solder resist layer 35 to expose portions of the wiring layer 34, whereby the wiring substrate 10 shown in FIG. 1 is completed. If necessary, metal layers may be formed on the exposed portions of the wiring layer 34. Examples of each of those metal layers are an Au film, an Ni/Au film formed by laying an Ni film and an Au film in this order, and an Ni/Pd/Au film formed by laying an Ni film, a Pd film and an Au film in this order. Instead of forming metal layers, OSP (organic solderability preservative) processing may be performed on the exposed portions of the wiring layer 34.

External connection terminals such as solder balls or lead pins may be formed on the exposed portions of the wiring layer 34 (or, on the metal layers formed thereon). The external connection terminals serve as terminals for electrical connections to a mounting board such as a mother board (not shown). However, the exposed portions of the wiring layer 34 (or, the metal layers formed thereon) themselves may be used as external connection terminals. The exposed portions of the wiring layer 34 in the respective openings 35x may be circular and about 200 to 1,000 μm in diameter.

Although only a single wiring substrate 10 is illustrated in connection with the above-mentioned manufacturing process, plural wiring substrates 10 may be formed together and separated into individual pieces thereafter. Although the two wiring layers 32 and 34 are formed on the surface 13b of the core substrate 13 in the above-mentioned manufacturing process, only one wiring layer or three or more wiring layers may be formed on the surface 13b of the core substrate 13.

As described above, in the first embodiment, the silicon layer 22 is joined to the surface 13a of the core substrate 13 by the bonding layer 21. Then, the through-holes 22x are formed through the bonding layer 21 and the silicon layer 22 so as to expose ends of the linear conductors 12, and the through-holes 22x are filled with a conductive material to form the penetration lines 24 so as to be connected to the exposed ends of the linear conductors 12. Since each penetration line 24 is connected to the linear conductors 12 without intervention of a bump, the density of connections and the reliability of connections can be increased.

Since the silicon layer 22 is laid on the core substrate 13 to form a laminate body, the silicon layer 22 is given sufficient strength and can be handled easily even though it is thin (e.g., about 20 to 50 μm).

Since the silicon layer 22 is thin (e.g., about 20 to 50 μm), the energy that is necessary for, for example, formation of the through-holes 22x can be reduced.

<First Modification of First Embodiment>

In a first modification of the first embodiment, each penetration line is a single layer. The same constituent members etc. as in the first embodiment will not be described in detail.

Figure 11:
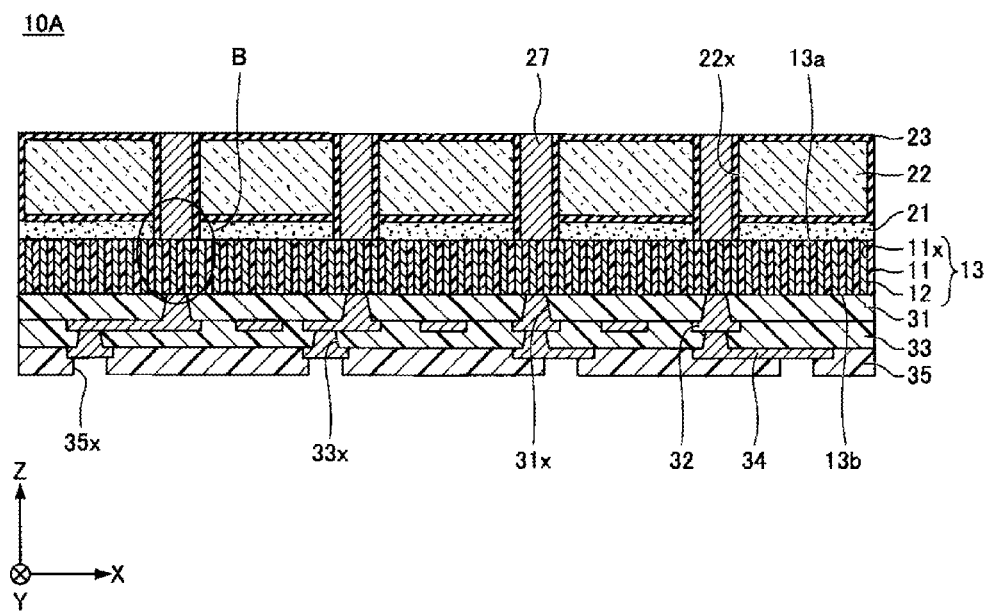
FIG. 11 illustrates a wiring substrate according to a first modification of the first embodiment.
Figure 12:
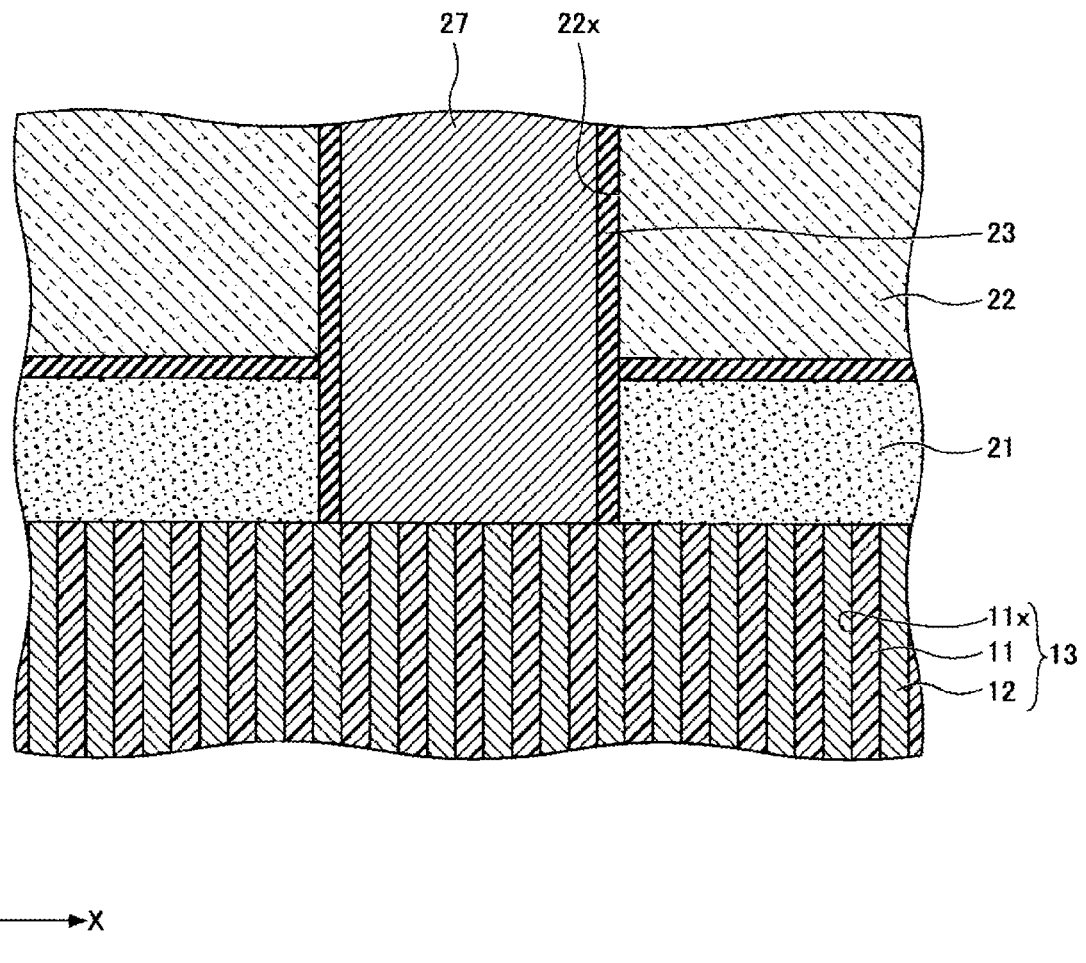
FIG. 12 enlargedly illustrates the part B in FIG. 11.

FIG. 11 illustrates a wiring substrate 10A according to the first modification of the first embodiment. FIG. 12 enlargedly illustrates the part B in FIG. 11. As shown in FIGS. 11 and 12, the wiring substrate 10A according to the first modification of the first embodiment is different from the wiring substrate 10 (see FIG. 1) in that the penetration lines 24 of the latter is replaced by penetration lines 27.

Each through-hole 22x whose inner side surface is coated with the insulating film 23 is filled with a single-layer penetration line 27. One end of the penetration line 27 is directly connected to ends of the linear conductors 12 which are exposed in the through-hole 22x. The other end of the penetration line 27 is exposed from the silicon layer 22 and is approximately flush with the top surface of the insulating film 23 which covers the top surface of the silicon layer 22. The other end of the penetration line 27 serves as an electrode pad to be electrically connected to a semiconductor chip or another wiring substrate (not shown). Alternatively, an electric circuit may be directly formed on the top surface of the wiring substrate 10A. Such electric circuit may include a wiring layer formed on the top surface of the insulating film 23 so as to be electrically connected to the respective penetration lines 27, and an insulating film covering the wiring layer. The material of the penetration lines 27 may be copper (Cu).

Figure 13:
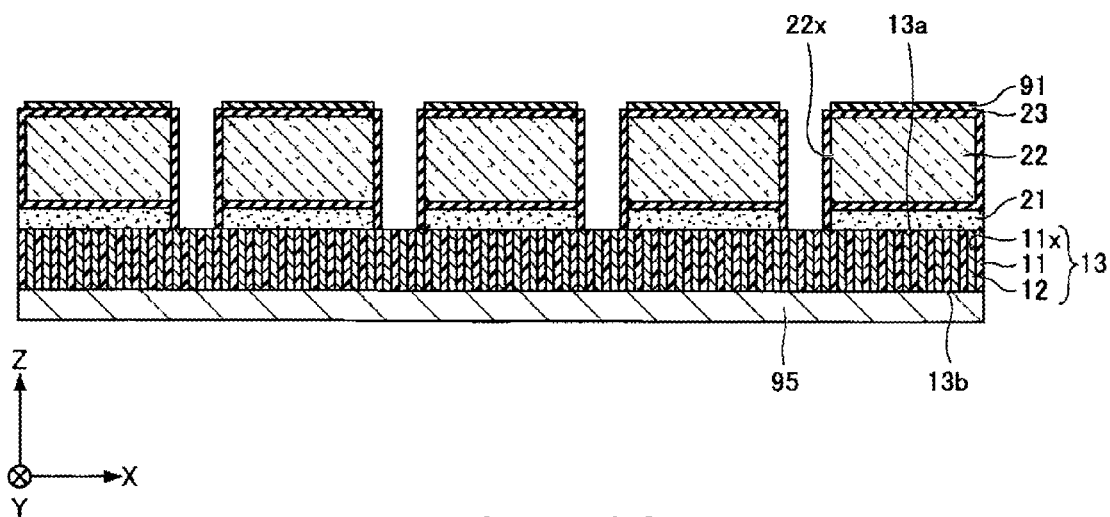
FIGS. 13 to 15 illustrate a manufacturing process of the wiring substrate according to a first modification of the first embodiment.
Figure 14:
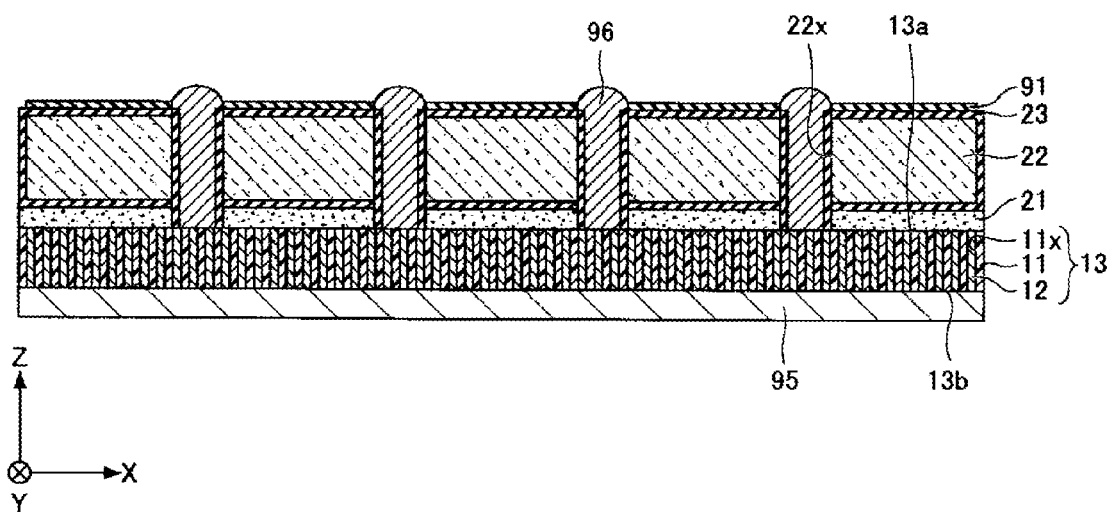

The wiring substrate 10A is manufactured by replacing the manufacturing steps shown in FIGS. 7-9 of the first embodiment with manufacturing steps shown in FIGS. 13 and 14. First, in the manufacturing step of FIG. 13, after completion of the manufacturing step shown in FIG. 6 of the first embodiment, insulating films 23 are formed on the inner side surfaces of the through-holes 22x. Then, the core substrate 13 to which the silicon layer 22 is joined is mounted on an electricity supply plate 95 such that the surface 13b comes into contact with the electricity supply plate 95. The electricity supply plate 95 may be a copper (Cu) plate. The electricity supply plate 95 is electrically connected to ends of the linear conductors 12 at the surface 13b of the core substrate 13. The insulating films 23 are formed in the same manner as described above with reference to FIG. 5.

In the manufacturing step of FIG. 14, conductive layers 96 are formed to fill the respective through-holes 22x and to project from the through-holes 22x by causing plating films to precipitate and grow from the surface 13b of the core substrate 13 by electrolytic plating using the electricity supply plate 95 and the associated linear conductors 12 as electricity supply paths. The conductive layers 96 become penetration layers 27 finally after removal of unnecessary portions. The material of the conductive layers 96 may be copper (Cu). After this manufacturing step, the core substrate 13 to which the silicon layer 22 is joined is removed from the electricity supply plate 95.

Then, as in the manufacturing step shown in FIG. 10 of the first embodiment, the protective layer 91 and the conductive layers 96 projected from the through-holes 22x (see FIG. 14) are polished away by CMP (chemical mechanical polishing) or the like to form penetration lines 27 (this step is not shown). The same manufacturing steps as described in the first embodiment are thereafter performed, whereby the wiring substrate 10A shown in FIG. 11 is completed.

An alternative manufacturing process is as follows. After an insulating layer 31, a wiring layer 32, an insulating layer 33 and a wiring layer 34 are laid sequentially on the surface 13b of the core substrate 13, a silicon layer 22 is joined to the surface 13a of the core substrate 13 by a bonding layer 21. Then, through-holes 22x are formed through the bonding layer 21 and the silicon layer 22. As long as the linear conductors 12, the wiring layer 32 and the wiring layer 34 are electrically connected, an electricity supply plate 95 may be disposed so as to be in contact with the wiring layer 34, and conductive layers 96 may be formed to fill the respective through-holes 22x and to project from the through-holes 22x by electrolytic plating using the electricity supply plate 95, the wiring layers 32 and 34 and the linear conductors 12 as electricity supply paths.

The first modification of the first embodiment provides the same advantages as the first embodiment and also provides the following advantages. Since the linear conductors 12 are used as part of electricity supply paths, the penetration lines 27 can be formed to fill the respective through-holes 22x from the surface 13a of the core substrate 13 by electrolytic plating without providing either the conductive layer 92 or the resist layer 93, that is, the manufacturing process can be simplified.

Since in the manufacturing step of FIG. 14 the conductive layers 96 (which becomes the penetration lines 27 finally) are each formed continuously with many linear conductors 12, the adhesion between each conductive layer 96 and the linear conductors 12 can be enhanced.

Figure 15:
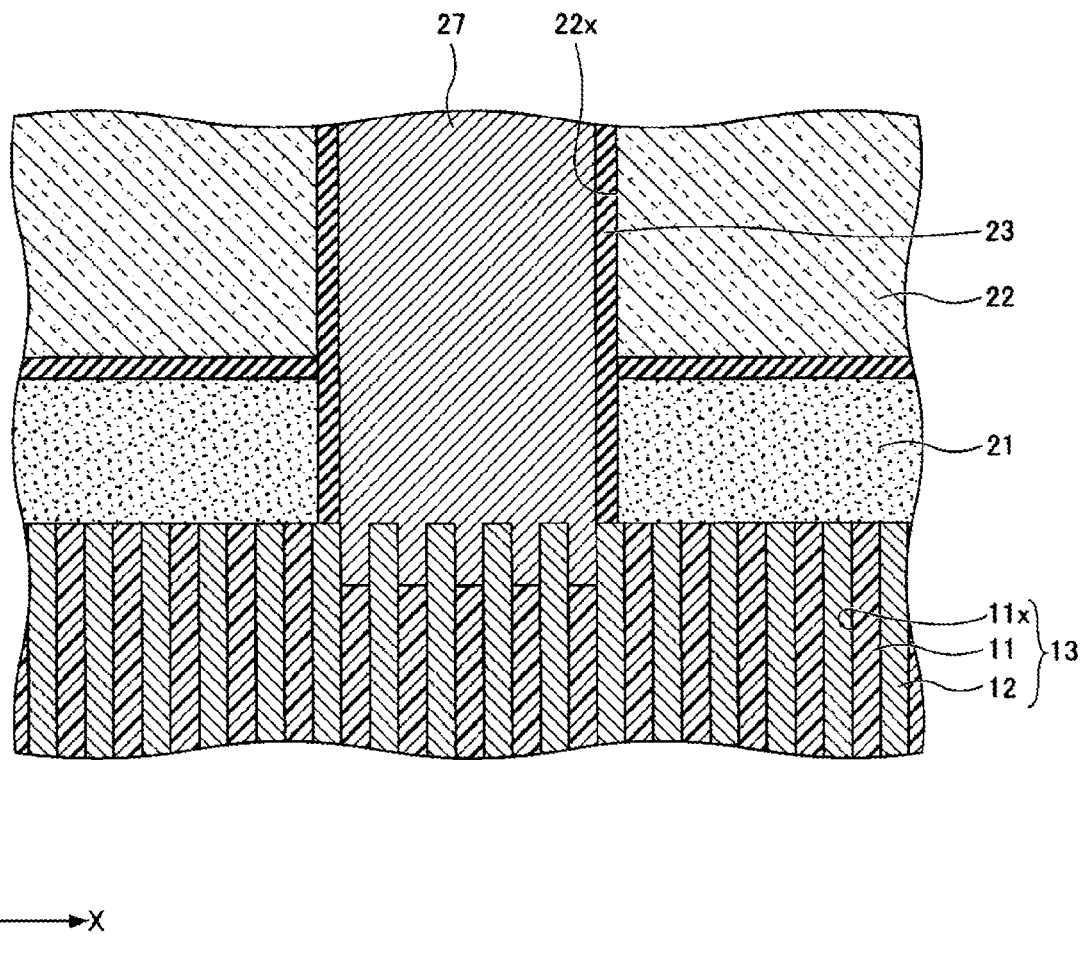

As shown in FIG. 15, in the manufacturing process corresponding to that shown in FIG. 6 of the first embodiment, the through-holes 22x may be formed so as to dig into the substrate body 11 so that a top portion (the top face and the side surface) of each linear conductor 12 is exposed from the substrate body 11. In other words, recesses are formed in the substrate body 11 (insulative base member) at positions of the respective through-holes 22x so as to expose the top face and the side surface of each linear conductor 12, and then, the through-holes 22x are filled with a conductive material for forming the penetration lines 27. As a result, in the manufacturing step of FIG. 14, each conductive layer 96 (penetration line 27) enters into the spaces between adjoining linear conductors 12. Thus, the adhesion between each conductive layer 96 and many associated linear conductors 12 can be enhanced due to the anchor effect. Further, in the manufacturing step of FIG. 14, when the conductive layers 96 are formed by electrolytic plating, the surface area of the linear conductors 12 that serve as part of the electricity supply paths is increased, thereby increasing the plating rate. Top portions of linear conductors 12 can be exposed from the substrate body 11 by, for example, adjusting the time of the etching for formation of the through-holes 22x.

<Second Modification of First Embodiment>

In a second modification of the first embodiment, a wiring layer is formed on both surfaces 13a and 13b of the core substrate 13. The same constituent members etc. as in the first embodiment will not be described in detail.

Figure 16:
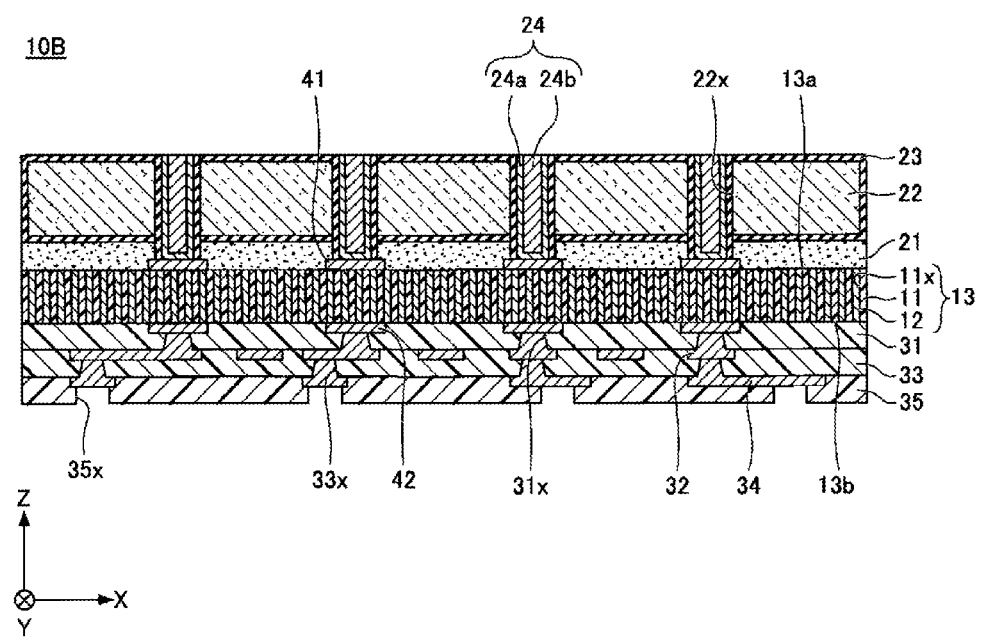
FIG. 16 illustrates a wiring substrate according to a second modification of the first embodiment.

FIG. 16 illustrates a wiring substrate 10B according to the second modification of the first embodiment. As shown in FIG. 16, the wiring substrate 10B according to the second modification of the first embodiment is different from the wiring substrate 10 (see FIG. 1) in that wiring layers 41 and 42 are formed on the respective surfaces 13a and 13b of the core substrate 13.

The wiring layer 41 is formed on the surface 13a of the core substrate 13. The wiring layer 41 is covered with the bonding layer 21, and portions of the wiring layer 41 are exposed in the respective through-holes 22x to be electrically connected to the one ends of the penetration lines 24, respectively. That is, the one end of each penetration line 24 is connected to ends of the linear conductors 12 indirectly via the wiring layer 41. And, the wiring layer 41 is electrically connected to the corresponding wiring layer 42 via the associated linear conductors 12. The material of the wiring layer 41 may be copper (Cu), and its thickness may be about 10 to 20 μm.

The wiring layer 42 is formed on the surface 13b of the core substrate 13. The material of the wiring layer 42 may be copper (Cu), and its thickness may be about 10 to 20 μm. The insulating layer 31 is formed on the surface 13b so as to cover the wiring layer 42, while exposing portions of the wiring layer 42 by via holes 31x. The via parts of the wiring layer 32 are electrically connected to the exposed portions of the wiring layer 42. The wiring layers 41 and 42 can be formed by sputtering or the like.

The same advantages as provided by the first embodiment are provided also in the case where a wiring layer is formed on both surfaces 13a and 13b of the core substrate 13 in the above-described manner.

<Third Modification of First Embodiment>

In a third modification of the first embodiment, wiring layers and an insulating layer are laid on the surface 13a of the core substrate 13. The same constituent members etc. as in the first embodiment will not be described in detail.

Figure 17:
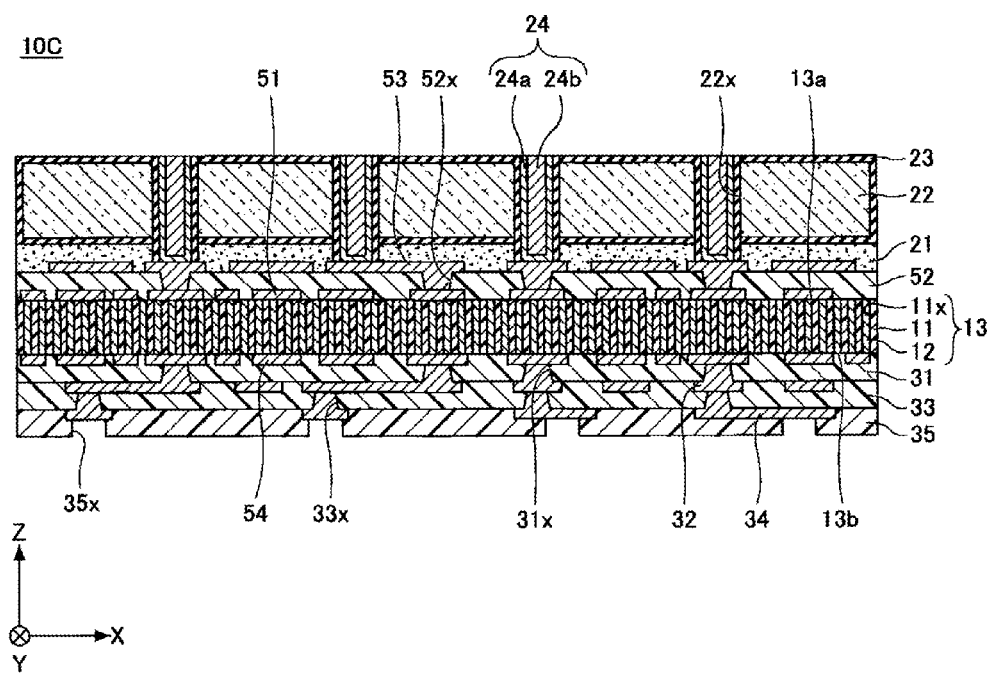
FIG. 17 illustrates a wiring substrate according to a third modification of the first embodiment.

FIG. 17 illustrates a wiring substrate 10C according to the third modification of the first embodiment. As shown in FIG. 17, the wiring substrate 10C according to the third modification of the first embodiment is different from the wiring substrate 10 (see FIG. 1) in that a wiring layer 51, an insulating layer 52 and a wiring layer 53 are laid between the surface 13a of the core substrate 13 and the bonding layer 21 and that a wiring layer 54 is formed on the surface 13b of the core substrate 13.

The wiring layer 51 is formed on the surface 13a of the core substrate 13. And, the wiring layer 51 is electrically connected to the corresponding wiring layer 54 via the associated linear conductors 12. The material of the wiring layer 51 may be copper (Cu), and its thickness may be about 10 to 20 μm. The insulating layer 52 is formed on the surface 13a of the core substrate 13 so as to cover the wiring layer 51. The insulating layer 52 may be made of the same insulative resin as the insulating layer 31. The thickness of the insulating layer 52 may be about 15 to 25 μm.

The wiring layer 53 includes via parts formed to fill respective via holes 52x in the insulating layer 52 and wiring parts formed on the surface of the insulating layer 52 to have predetermined planar patterns. The via holes 52x are truncated-cone-shaped through-holes which are wider on the side of the bonding layer 21 and reach the top surface of the wiring layer 51 to expose portions thereof.

The via parts of the wiring layer 53 are electrically connected to the exposed portions of the wiring layer 51. The material of the wiring layer 53 may be copper (Cu). The thickness of the wiring parts of the wiring layer 53 may be about 10 to 20 μm. The wiring layer 53 is covered with the bonding layer 21, and portions of the wiring layer 53 are exposed in the respective through-holes 22x to be electrically connected to the one ends of the penetration lines 24, respectively. That is, the one end of each penetration line 24 is connected to ends of the linear conductors 12 indirectly via the corresponding portions of the wiring layers 51 and 53.

The wiring layer 54 is formed on the surface 13b of the core substrate 13. The material of the wiring layer 54 may be copper (Cu), and its thickness may be about 10 to 20 μm. The insulating layer 31 is formed on the surface 13b of the core substrate 13 so as to cover the wiring layer 54, while exposing portions thereof. The via parts of the wiring layer 32 are electrically connected to the exposed portions of the wiring layer 54. The wiring layer 51, the insulating layer 52, the wiring layer 53 and the wiring layer 54 can be formed by the same methods as the wiring layer 32, the insulating layer 33, etc. are formed.

The same advantages as provided by the first embodiment are provided also in the case where an insulating layer and wiring layers are laid on the surface 13a of the core substrate 13 in the above-described manner.

<Fourth Modification of First Embodiment>

In a fourth modification of the first embodiment, both surfaces of the core substrate 13 are provided with a silicon layer. The same constituent members etc. as in the first embodiment or its third modification will not be described in detail.

Figure 18:
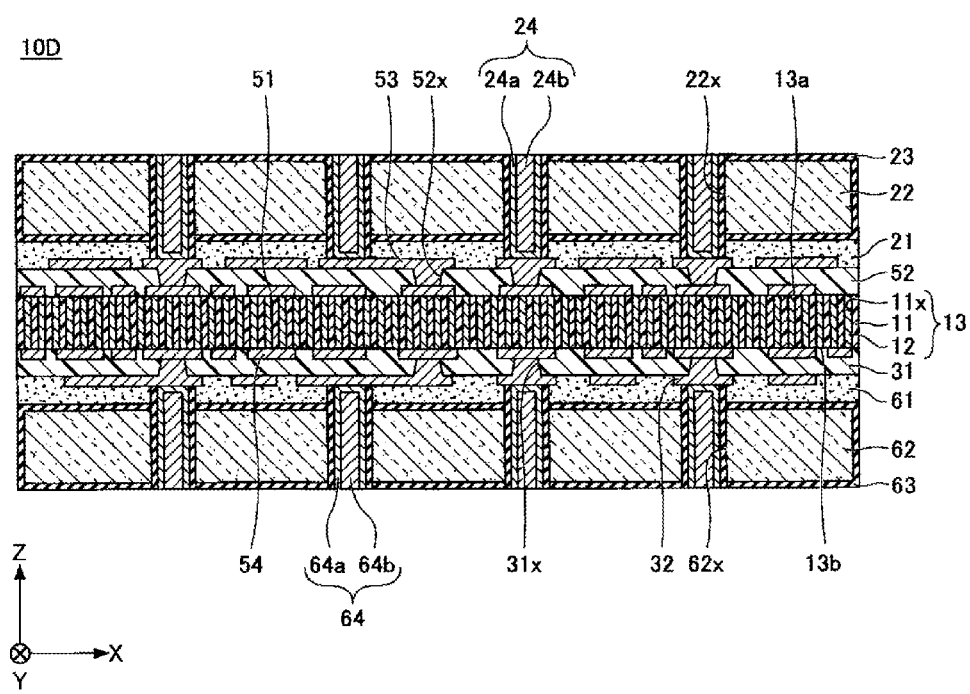
FIG. 18 illustrates a wiring substrate according to a fourth modification of the first embodiment.

FIG. 18 illustrates a wiring substrate 10D according to the fourth modification of the first embodiment. As shown in FIG. 18, the wiring substrate 10D according to the fourth modification of the first embodiment is different from the wiring substrate 10C (see FIG. 17) in that another silicon layer 62 is formed on the surface 13b of the core substrate 13.

A bonding layer 61 is formed on the insulating layer 31 so as to cover the wiring layer 32, and the silicon layer 62 is formed on the bonding layer 61. Through-holes 62x are formed through the bonding layer 61 and the silicon layer 62, and are filled with respective penetration lines 64 each of which is composed of a first layer 64a and a second layer 64b. Each penetration line 64 is electrically connected to the wiring layer 32 which is exposed in the associated through-hole 62x.

The bonding layer 61, the silicon layer 62, the insulating film 63 and the penetration lines 64 (first layers 64a and second layers 64b) correspond to the bonding layer 21, the silicon layer 22, the insulating film 23 and the penetration lines 24 (first layers 24a and second layers 24b), respectively, and hence will not be described in detail.

The same advantages as provided by the first embodiment are provided also in the case where both surfaces of the core substrate 13 are provided with a silicon layer in the above-described manner.

<Fifth Modification of First Embodiment>

In a fifth modification of the first embodiment, silicon layers are stacked on one surface of the core substrate 13. The same constituent members etc. as in the first embodiment or its third modification will not be described in detail.

Figure 19:
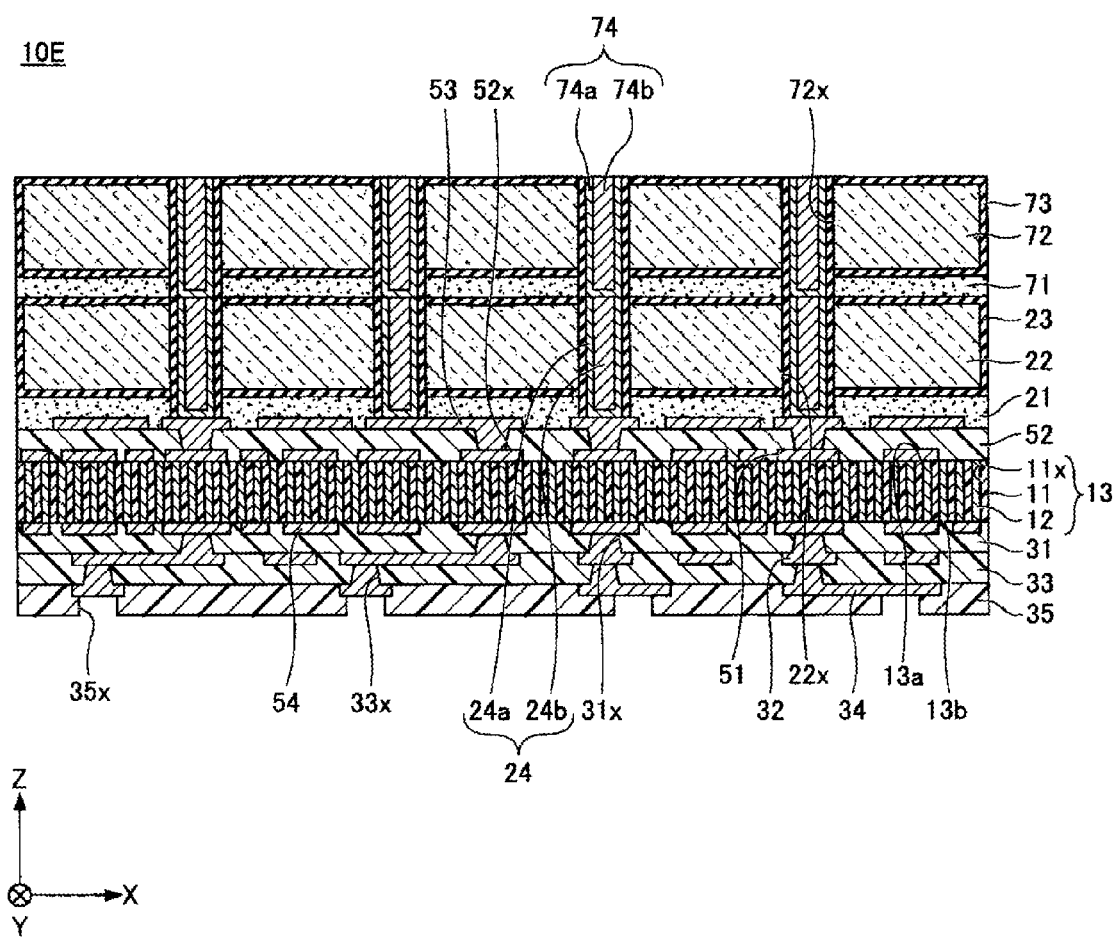
FIG. 19 illustrates a wiring substrate according to a fifth modification of the first embodiment.

FIG. 19 illustrates a wiring substrate 10E according to the fifth modification of the first embodiment. As shown in FIG. 19, the wiring substrate 10E according to the fifth modification of the first embodiment is different from the wiring substrate 10C (see FIG. 17) in that another silicon layer 72 is formed over the silicon layer 22 which is formed on the surface 13a of the core substrate 13.

A bonding layer 71 is formed on the surface of the silicon layer 22 which is not in contact with the bonding layer 21, and the silicon layer 72 is laid on the bonding layer 71. Through-holes 72x are formed through the bonding layer 71 and the silicon layer 72, and are filled with respective penetration lines 74 each of which is composed of a first layer 74a and a second layer 74b. Each penetration line 74 is electrically connected to one end of the corresponding penetration line 24 through the associated through-hole 72x.

The bonding layer 71, the silicon layer 72, the insulating film 73 and the penetration lines 74 (first layers 74a and second layers 74b) correspond to the bonding layer 21, the silicon layer 22, the insulating film 23 and the penetration lines 24 (first layers 24a and second layers 24b), respectively, and hence will not be described in detail.

The same advantages as provided by the first embodiment are provided also in the case where silicon layers are stacked on one surface of the core substrate 13 in the above-described manner.

Three or more silicon layers may be stacked on one surface of the core substrate 13, and silicon layers may be stacked on both surfaces of the core substrate 13.

<Sixth Modification of First Embodiment>

Although a silicon layer(s) in which no semiconductor circuits are illustrated in connection with the first embodiment and its modifications, a silicon layer(s) in which semiconductor circuits are formed may be used in the first embodiment or each of its modifications. A semiconductor device in which a silicon layer formed with semiconductor circuits is joined to at least one of the two surfaces of the core substrate 13 will be described as a sixth modification of the first embodiment.

When semiconductor circuits are formed on one surface (circuit formation surface) of a silicon layer, preferably the silicon layer is joined to the core substrate 13 such that the circuit formation surface is opposite to the core substrate 13 and that the back surface (opposite to the circuit formation surface) faces the core substrate 13, in order to, for example, avoid the damage to the circuit formation surface when removing the protective layer 91 etc. in the manufacturing step of FIG. 10.

Through-holes may be formed through a silicon layer either before or after the semiconductor circuits are formed in the silicon layer. When the silicon layer is joined to the core substrate 13 such that the circuit formation surface thereof is opposite to the core substrate 13, the through-holes may be formed so as to penetrate through electrode pads of the semiconductor circuits, so that the electrode pads are electrically connected to respective penetration lines.

<Second Embodiment>

In a second embodiment, a wiring layer is formed on both surfaces of the core substrate 13 and glass layers are formed so as to cover the respective wiring layers. The same constituent members etc. as in the first embodiment will not be described in detail.

<Configuration of Wiring Substrate According to Second Embodiment>

Figure 20:
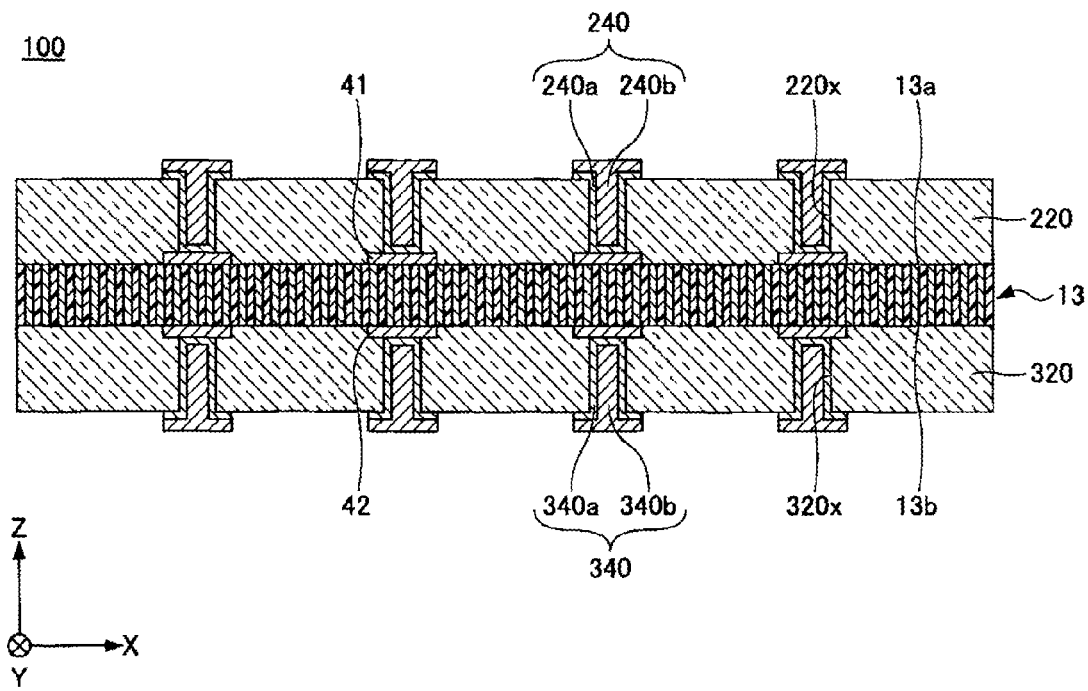
FIG. 20 cross-sectionally illustrates a wiring substrate according to a second embodiment.

FIG. 20 cross-sectionally illustrates a wiring substrate 100 according to the second embodiment. As shown in FIG. 20, the wiring substrate 100 has the core substrate 13, a wiring layer 41, a wiring layer 42, a glass layer 220, wiring layers 240, a glass layer 320 and wiring layers 340.

The glass layer 220 is formed on the surface 13a of the core substrate 13 so as to cover the wiring layer 41. In the case of using a grass layer, it is possible to omit a bonding layer between the glass layer and the core substrate 13, unlike the case of using a silicon layer. The thickness of the glass layer 220 may be about 20 to 50 μm. Through-holes 220x are formed through the glass layer 220. Each through-hole 220x may be approximately circular in a plan view and about 3 to 30 μm in diameter.

Each wiring layer 240 includes a via part formed to fill the associated through-hole 220x and a wiring part formed on the glass layer 220. Each wiring layer 240 is electrically connected to the wiring layer 41 which is exposed in the associated through-hole 220x. In each wiring layer 240, a second layer 240b is laid on a first layer 240a.

The first layer 240a may be formed by laying a titanium (Ti) film and a copper (Cu) film sequentially in this order. The first layer 240a is formed on the surfaces of the glass layer 220 etc. The thickness of the first layer 240a may be about 1 μm. The second layer 240b is formed to cover the first layer 240a and to fill the associated through-hole 220x. The material of the second layer 240b may be copper (Cu).

The glass layer 320 is formed on the surface 13b of the core substrate 13 so as to cover the wiring layer 42. No bonding layer exists between the glass layer 320 and the surface 13b of the core substrate 13. The material and the thickness of the glass layer 320 may be the same as of the glass layer 220. Through-holes 320x are formed through the glass layer 320. The plan-view shape and the diameter of each through-hole 320x may be approximately the same as of each through-hole 220x.

Each wiring layer 340 includes a via part formed to fill the associated through-hole 320x and a wiring part formed on the glass layer 320. Each wiring layer 340 is electrically connected to the wiring layer 42 which is exposed in the associated through-hole 320x. In each wiring layer 340, a second layer 340b is laid on a first layer 340a. The first layer 340a and the second layer 340b of each wiring layer 340 correspond to the first layer 240a and the second layer 240b of each wiring layer 240, and hence their material, thickness, etc. will not be described.

The material of the glass layers 220 and 320 may be low-melting-point glass. The low-melting-point glass may be glass whose melting temperature is lowered by mixing bismuth, indium, or the like into borosilicate glass or glass whose melting temperature is lowered by mixing lead, an alkali metal, or the like into borosilicate glass.

Since the glass layers 220 and 320 are insulators, it is not necessary to form an insulating film corresponding to the insulating film 23 of the wiring substrate 10 (see FIG. 1 etc.) on the surfaces of the glass layers 220 and 320 including inner surfaces of the through-holes 220x and 320x.

[Manufacturing Method of Wiring Substrate According to Second Embodiment]

Figure 21:
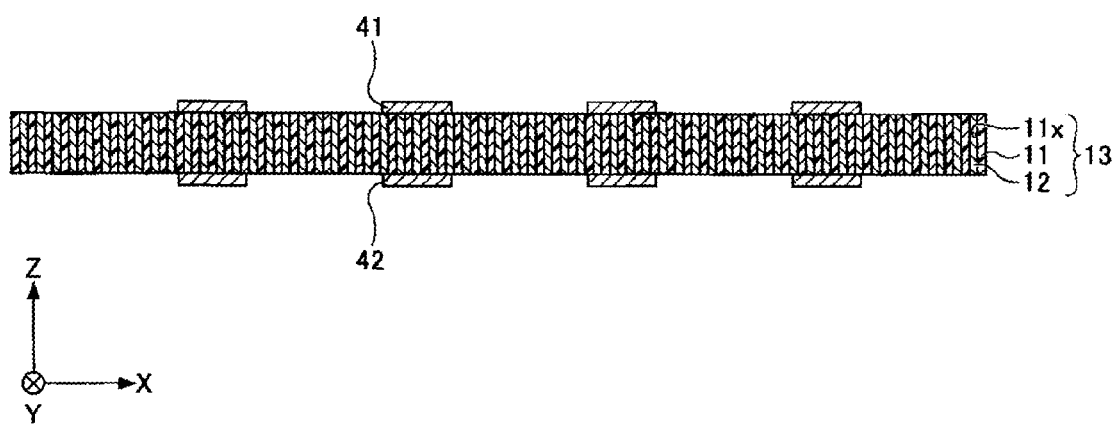
FIGS. 21 to 23 illustrate a manufacturing process of the wiring substrate according to the second embodiment.
Figure 22:
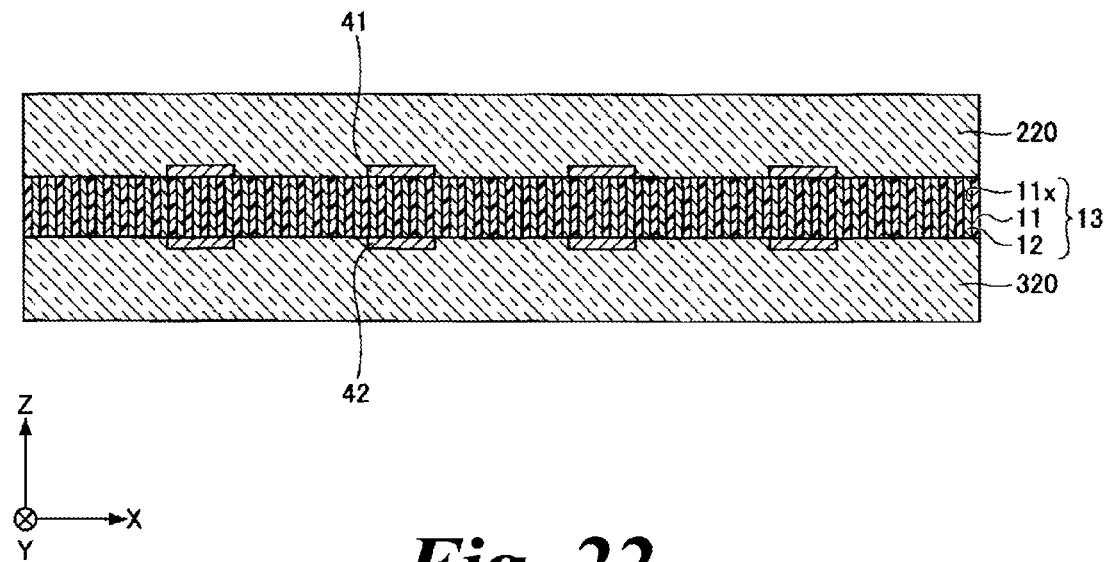
Figure 23:
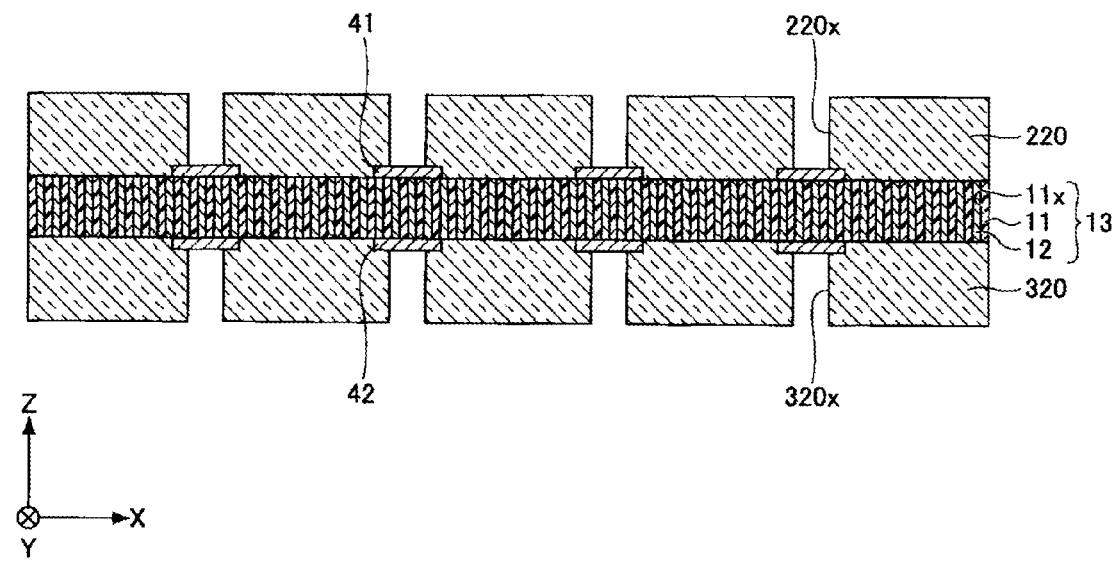

Next, a manufacturing method of the wiring substrate 100 according to the second embodiment will be described. FIGS. 21-23 illustrate a manufacturing process of the wiring substrate 100 according to the second embodiment.

First, in a manufacturing step shown in FIG. 21, a core substrate 13 is manufactured in the same manners as shown in FIGS. 3 and 4, and wiring layers 41 and 42 are formed on respective surfaces 13a and 13b of the core substrate 13 by sputtering, for example. The wiring layer 41 is electrically connected to the wiring layer 42 by associated linear conductors 12. The material of the wiring layers 41 and 42 may be copper (Cu), and their thicknesses may be about 10 to 20 μm.

Then, glass layers 220 and 320 are formed in a manufacturing step of FIG. 22. More specifically, for example, low-melting-point glass paste is applied to the surfaces 13a and 13b of the core substrate 13 by printing so as to cover the wiring layers 41 and 42 and is baked into glass layers 220 and 320. Alternatively, for example, glass layers 220 and 320 may be formed by disposing solid low-melting-point glass members on the respective surfaces 13a and 13b of the core substrate 13, softening them by heating them at about 450° C. while pressing them, and solidifying the softened low-melting-point glass members. The thicknesses of the glass layers 220 and 320 may be about 20 to 50 μm.

The low-melting-point glass as the material of the glass layers 220 and 320 may be glass whose melting temperature is lowered by mixing bismuth, indium, or the like into borosilicate glass or glass whose melting temperature is lowered by mixing lead, an alkali metal, or the like into borosilicate glass.

In a manufacturing step of FIG. 23, through-holes 220x are formed through the glass layer 220 and through-holes 320x are formed through the glass layer 320. The through-holes 220x and 320x may be formed by dry etching or laser processing. Each of the through-holes 220x and 320x may be approximately circular in a plan view and about 3 to 30 μm in diameter. After completion of the manufacturing step of FIG. 23, wiring layers 240 and 340 are formed by a semi-additive method or the like, whereby the wiring substrate 100 shown in FIG. 20 is completed.

As described above, in the second embodiment, the glass layer 220 is joined to the surface 13a of the core substrate 13 directly, that is, without a bonding layer. Then, the through-holes 220x are formed through the glass layer 220 so as to expose portions of the wiring layer 41 and are filled with a conductive material to form the wiring layers 240 which are electrically connected to the exposed portions of the wiring layer 41. On the other hand, the glass layer 320 is joined to the surface 13b of the core substrate 13 directly, that is, without a bonding layer. Then, the through-holes 320x are formed through the glass layer 320 so as to expose portions of the wiring layer 42 and are filled with a conductive material to form the wiring layers 340 which are electrically connected to the exposed portions of the wiring layer 42.

As such, the second embodiment provides the following advantages in addition to the advantages of the first embodiment. The wiring substrate 100 is composed of the core substrate 13, the wiring layers 41 and 42, the glass layers 220 and 320 and the wiring layers 240 and 340, and does not employ any organic resin bonding layers whose thermal expansion coefficient is several tens of parts per million per ° C. Therefore, the degrees of mismatch between the constituent materials caused by the difference in the thermal expansion coefficients thereof, the effect of which increases as the applied heat increases, can be reduced.

And, the heat resistance of the wiring substrate 100 can be increased because of the absence of organic resin bonding layers which are low in heat resistance.

Further, the manufacturing cost of the wiring substrate 100 can be reduced because the glass layers 220 and 320 are less expensive than the silicon layer 22.

Still further, when the wiring layers 41 and 42 are formed with alignment marks, the alignment marks are seen through the glass layers 220 and 320. The alignment of the wiring substrate 100 can thus be increased.

Although a configuration having two glass layers 220 and 320 on the both surfaces 13a and 13b of the core substrate 13 is exemplified, the above advantages can also be obtained when a glass layer is formed only on one of the surfaces 13a and 13b of the core substrate 13 while forming no layer on the other/opposite surface. The above advantages can also be obtained when a wiring layer is formed on both surfaces 13a and 13b of the core substrate 13 and a glass layer is formed only on one of the surfaces 13a and 13b so as to cover the wiring layer.

When wiring layers 41 and 42 are formed on the respective surfaces 13a and 13b of the core substrate 13 but a glass layer is formed to cover only one of the wiring layers 41 and 42, an insulating layer made of an epoxy insulative resin or the like may be formed to cover the other of the wiring layers 41 and 42 (not covered with the glass layer), and another wiring layer may be formed on the insulating layer so as to be electrically connected to the underlying wiring layer.

The glass layers 220 and 320 may be directly formed on the respective surfaces 13a and 13b of the core substrate 13 without providing the wiring layers 41 and 42 (i.e., from the wiring substrate 100 shown in FIG. 20, the wiring layers 41 and 42 may be removed).

The second embodiment can be modified correspondingly with the first embodiment or its first or second modification.
<First Modification of Second Embodiment>

In a first modification of the second embodiment, wiring layers are formed to provide a coaxial-line-like shielding property. The same constituent members etc. as in the second embodiment will not be described in detail.

Figure 24:
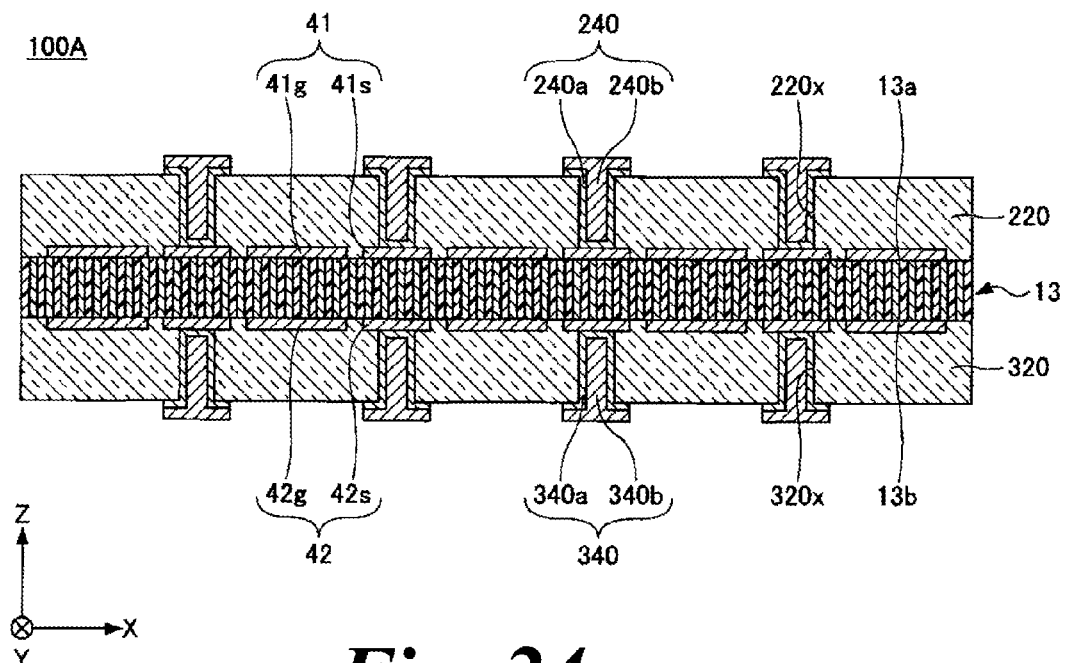
FIG. 24 illustrates a wiring substrate according to a first modification of the second embodiment.
Figure 25:
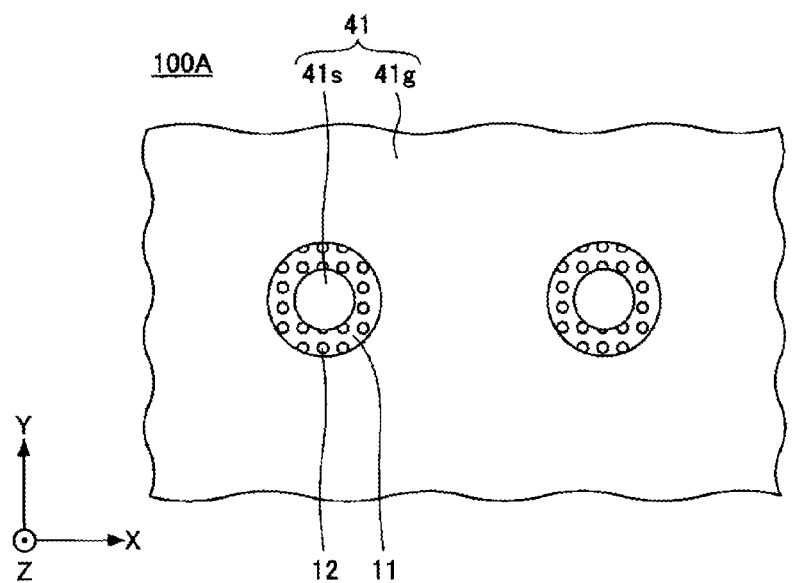
FIG. 25 partially illustrates the wiring substrate according to the first modification of the second embodiment from above.

FIG. 24 illustrates a wiring substrate 100A according to the first modification of the second embodiment. FIG. 25 is a partial plan view of the wiring substrate 100A according to the first modification of the second embodiment. In FIG. 25, the glass layers 220 and 240 are omitted. As shown in FIGS. 24 and 25, the wiring substrate 100A according to the first modification of the second embodiment is different from the wiring substrate 100 (see FIG. 20) in that wiring layers 41 and 42 are formed to provide a coaxial-line-like shielding property.

In the wiring layers 41 and 42, signal lines 41s and 42s are provided for signal transmission, and ground (GND) lines 41g and 42g are electrically connected to a reference voltage (GND) of the wiring substrate 100A. And, the GND lines 41g and 42g and associated linear conductors 12 connecting them surround the signal lines 41s and 42s and associated linear conductors 12 connecting them, with a predetermined interval.

That is, a group of the signal lines 41s and 42s and the associated linear conductors 12 functions as a signal line of a coaxial line, and a group of the GND lines 41g and 42g and the associated linear conductors 12 functions as a ground line of the coaxial line. This provides an advantage of shielding the signal lines 41s and 42s and the associated linear conductors 12 from external noise.

Also, the electrical coupling (capacitive coupling) between adjoining groups of the signal lines 41s and 42s and the associated linear conductors 12 can be reduced. As a result, each group of the signal lines 41s and 42s and the associated linear conductors 12 is also prevented from becoming a noise source.

The filling ratio of the wiring layer 41 in the surface 13a of the core substrate 13 and that of the wiring layer 42 in the surface 13b of the core substrate 13 are larger than the filling ratio of those in the wiring substrate 100 (see FIG. 20). Therefore, by roughening the surfaces of the wiring layers 41 and 42 before formation of the glass layers 220 and 320, the adhesion between the wiring layers 41 and 42 and the glass layers 220 and 320 can be increased by the anchor effect.

The coaxial-line-like structure employed in the first modification of the second embodiment can also be applied to the second to fifth modifications of the first embodiment.
<Second Modification of Second Embodiment>

In a second modification of the second embodiment, a functional element is formed on a glass layer. The same constituent members etc. as in the second embodiment will not be described in detail.

Figure 26:
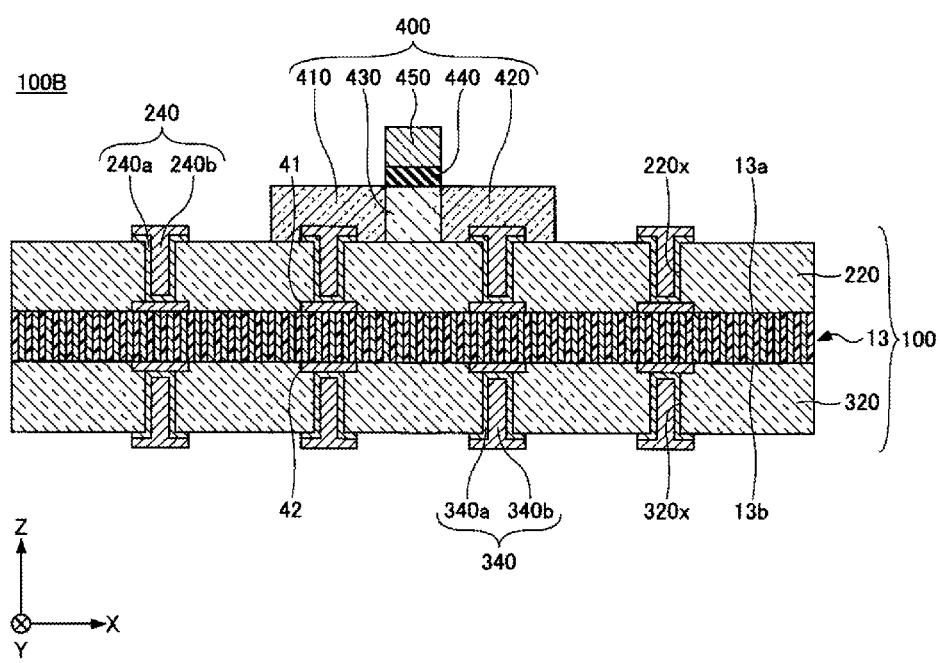
FIG. 26 illustrates a wiring substrate according to a second modification of the second embodiment.

FIG. 26 illustrates a wiring substrate 100B according to the first modification of the second embodiment. As shown in FIG. 26, in the wiring substrate 100B, a functional element 400 is formed on the glass layer 220 of the wiring substrate 100 of FIG. 20. For example, the functional element is a semiconductor element such as a transistor, a photodiode, or a laser diode, a passive element such as a capacitor, or the like element.

Although in this modification a TFT (thin-film transistor) is formed as the functional element 400, an LED (lightemitting diode) may be formed as the functional element 400. And, a reflection plate for reflecting light that is output from the LED to convert its optical path may also be formed.

In the wiring substrate 100B, the functional element 400 which is formed on the glass layer 220 is a top-gate FET which has a source electrode 410, a drain electrode 420, a channel region 430, a gate insulating film 440 and a gate electrode 450.

The source electrode 410 and the drain electrode 420 are disposed side by side in X direction at a predetermined interval, and electrically connected to respective wiring layers 240. The channel region 430 is sandwiched between the source electrode 410 and the drain electrode 420. The gate electrode 450 is formed over (approximately coextends with) the channel region 430 via the gate insulating film 440. A current flowing between the source electrode 410 and the drain electrode 420 can be controlled by a voltage applied to the gate electrode 450.

The source electrode 410 and the drain electrode 420 may be made of amorphous silicon, and the channel region 430 may be made of polysilicon. The thicknesses of the source electrode 410, the drain electrode 420 and the channel region 430 may be about 50 nm.

The gate insulating film 440 may be made of silicon oxide ($SiO_2$) or silicon nitride ($SiN_x$), and its thickness may be about 80 nm. The gate electrode 450 may be made of molybdenum (Mo) or aluminum (Al), and its thickness may be about 50 nm.

For example, the source electrode 410, the drain electrode 420 and the channel region 430 are formed in the following manner. An amorphous silicon thin film of about 50 nm in thickness is formed by plasma CVD or the like on the glass layer 220 in a region where the source electrode 410, the drain electrode 420 and the channel region 430 are to be formed.

Then, to perform annealing, pulse excimer laser light of 308 nm in wavelength, for example, is applied to a portion of the amorphous silicon thin film where the channel region 430 is to be formed. As a result, the portion, illuminated by the excimer laser light, of the amorphous silicon thin film is heated and melted. When cooled, the amorphous silicon is re-crystallized into polysilicon. A polysilicon channel region 430 is thus formed. An amorphous silicon source electrode 410 and drain electrode 420 are formed on the two respective sides of the channel region 430.

The plasma CVD may be performed such that an amorphous silicon thin film is grown on the glass layer 220 by decomposing material gases which are silane ($SiH_4$) and disilane ($Si_2H_6$) by glow discharge. Although the temperatures of the glass layer 220 and its vicinity rise up to about 400° C. in this process, a problem of damaging of the glass layer 220 is avoided when the glass layer 220 is made of low-melting-point glass whose softening temperature is about 450° C. And, this process is free of a problem of damaging of a bonding layer because no organic resin bonding layers having a low melting temperature are used.

Each of the gate insulating film 440 and the gate electrode 450 may be formed by photolithography.

The wiring substrate 100B is superior in heat resistance because it does not have organic resin bonding layers which are low in heat resistance. Therefore, the wiring substrate 100B in which the functional element 400 is formed on the glass layer 220 of the wiring substrate 100 can be realized by using, for example, plasma CVD in which the temperatures increase up to about 400° C. A functional element may be formed on the glass layer 320.

Although the embodiments and their modifications are exemplified, the invention should not be limited thereto, and various changes and replacements can be made in the above embodiments and modifications within the scope of the invention.

For example, to increase the heat radiation, a portion (e.g., peripheral portion) of the core substrate 13 may be a metal region in which no linear conductors 12 are formed. The metal region may be made of aluminum (Al). For example, the metal region is formed as a portion of the core substrate 13 by masking the portion concerned of the core substrate 13 when the through-holes 11x are formed by anodic oxidation or the like in the manufacturing step of FIG. 3.

In the manufacturing methods of the wiring substrates 10 etc., the silicon layer 22 may be joined to the surface 13a of the core substrate 13 by the bonding layer 21 after the through-holes 22x are formed through the silicon layer 22.

The embodiments and modifications may be appropriately combined.

Although the silicon layer and the glass layer are exemplified, a layer made of an inorganic material may be used as long as it is capable of realizing a planar edge plane.

The invention claimed is:

1. A wiring substrate comprising:
   a core substrate having an insulative base member, the insulative base member having a first surface and a second surface, a plurality of linear conductors penetrating through the insulative base member from the first surface to the second surface, the plurality of linear conductors being embedded in the core substrate such that an interval between any two adjoining linear conductors of the plurality of linear conductors is smaller than a diameters of each of the two adjoining linear conductors;
   an inorganic material layer joined to at least one of the first surface and the second surface of the insulative base member; and
   a penetration line penetrating through the inorganic material layer,
   wherein one end of the penetration line is directly connected to ends of a corresponding part of the plurality of linear conductors in the core substrate, without intervention of a bump.

2. The wiring substrate of claim 1, further comprising:
   a wiring layer electrically connected to one end of the corresponding part of each of the linear conductors,
   wherein the one end of the penetration line is directly connected to the wiring layer.

3. The wiring substrate of claim 1,
   wherein a recess is formed in the insulative base member so that the ends and side surfaces of the corresponding part of the linear conductors are exposed, and
   wherein the penetration line extends into the recess so that the one end of the penetration line directly contacts the ends and side surfaces of the corresponding part of the linear conductors which are exposed within the recess.

4. The wiring substrate of claim 1,
   wherein the inorganic material layer is a silicon layer.

5. The wiring substrate of claim 4,
   wherein another silicon layer is laid on the silicon layer.

6. The wiring substrate of claim 4,
   wherein a semiconductor circuit is formed on at least one surface of the silicon layer.

7. The wiring substrate of claim 1,
   wherein the inorganic material layer is a glass layer.

8. The wiring substrate of claim 7,
   wherein the glass layer is directly joined to at least the one of the first surface and the second surface of the insulative base member.

9. A semiconductor device comprising:
the wiring substrate of claim 7; and
a functional element formed on the glass layer so as to be electrically connected to at least part of the penetration line.

10. The wiring substrate of claim 1, further comprises:
a bonding layer between the core substrate and the inorganic material layer,
wherein the penetration line penetrates the inorganic material layer and the bonding layer to reach the linear conductors in the core substrate.

* * * * *